United States Patent
Ali et al.

(10) Patent No.: US 9,853,363 B2
(45) Date of Patent: Dec. 26, 2017

(54) METHODS AND APPARATUS TO CONTROL MUTUAL COUPLING BETWEEN ANTENNAS

(75) Inventors: Shirook M. Ali, Milton (CA); John Bradley Deforge, Chelsea (CA)

(73) Assignee: BlackBerry Limited, Waterloo (CA)

( * ) Notice: Subject to any disclaimer, the term of this patent is extended or adjusted under 35 U.S.C. 154(b) by 431 days.

(21) Appl. No.: 13/542,686

(22) Filed: Jul. 6, 2012

(65) Prior Publication Data

US 2014/0011460 A1    Jan. 9, 2014

(51) Int. Cl.

| | |
|---|---|
| *H04B 7/00* | (2006.01) |
| *H01Q 21/28* | (2006.01) |
| *H01Q 1/24* | (2006.01) |
| *H01Q 1/52* | (2006.01) |
| *H04B 17/12* | (2015.01) |
| *H04B 17/13* | (2015.01) |
| *H04B 17/21* | (2015.01) |
| *H03H 7/40* | (2006.01) |

(52) U.S. Cl.
CPC ............. *H01Q 21/28* (2013.01); *H01Q 1/243* (2013.01); *H01Q 1/523* (2013.01); *H04B 17/12* (2015.01); *H04B 17/13* (2015.01); *H04B 17/21* (2015.01); *H03H 7/40* (2013.01)

(58) Field of Classification Search
USPC ...... 343/745, 750, 852, 861; 455/77, 75, 78, 455/126
See application file for complete search history.

(56) References Cited

U.S. PATENT DOCUMENTS

| | | |
|---|---|---|
| 2,745,067 A | 5/1956 | True |
| 3,117,279 A | 1/1964 | Ludvigson |
| 3,160,832 A | 12/1964 | Beitman |
| 3,390,337 A | 6/1968 | Beitman |
| 3,443,231 A | 5/1969 | Roza |
| 3,509,500 A | 4/1970 | McNair |
| 3,571,716 A | 3/1971 | Hill |

(Continued)

FOREIGN PATENT DOCUMENTS

| | | |
|---|---|---|
| CN | 101640949 A | 2/2010 |
| CN | 201765685 U | 3/2011 |

(Continued)

OTHER PUBLICATIONS

Huang, Libo et al., "Theoretical and experimental investigation of adaptive antenna impedance matching for multiband mobile phone applications", IEEE, Sep. 7, 2005, 13-17.

(Continued)

*Primary Examiner* — Nay A Maung
*Assistant Examiner* — Erica Fleming-Hall
(74) *Attorney, Agent, or Firm* — Guntin & Gust, PLC; Jay H. Anderson

(57) ABSTRACT

A system that incorporates teachings of the subject disclosure may include, for example, a method for comparing a received signal from a first antenna to a reference signal transmitted by a second antenna, determining from the comparison one or more compensation parameters, and tuning a compensation circuit according to the one or more compensation parameters, where the one or more compensations parameters configure the compensation circuit to reduce mutual coupling between the first and second antennas. Other embodiments are disclosed.

31 Claims, 14 Drawing Sheets

(56) References Cited

U.S. PATENT DOCUMENTS

| | | |
|---|---|---|
| 3,590,385 A | 6/1971 | Sabo |
| 3,601,717 A | 8/1971 | Kuecken |
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta |
| 4,227,256 A | 10/1980 | O'Keefe |
| 4,383,441 A | 5/1983 | Willis |
| 4,476,578 A | 10/1984 | Gaudin |
| 4,493,112 A | 1/1985 | Bruene |
| 4,509,019 A | 4/1985 | Banu et al. |
| 4,777,490 A | 10/1988 | Sharma |
| 4,799,066 A | 1/1989 | Deacon |
| 4,965,607 A | 10/1990 | Wilkins |
| 4,970,478 A | 11/1990 | Townley et al. |
| 4,980,656 A | 12/1990 | Duffalo |
| 5,032,805 A | 7/1991 | Elmer |
| 5,142,255 A | 8/1992 | Chang |
| 5,177,670 A | 1/1993 | Shinohara |
| 5,195,045 A | 3/1993 | Keane |
| 5,200,826 A | 4/1993 | Seong |
| 5,212,463 A | 5/1993 | Babbitt |
| 5,216,392 A | 6/1993 | Fraser et al. |
| 5,230,091 A | 7/1993 | Vaisanen |
| 5,243,358 A | 9/1993 | Sanford |
| 5,258,728 A | 11/1993 | Taniyoshi |
| 5,276,912 A | 1/1994 | Siwiak |
| 5,301,358 A | 4/1994 | Gaskill |
| 5,307,033 A | 4/1994 | Koscica |
| 5,310,358 A | 5/1994 | Johnson |
| 5,312,790 A | 5/1994 | Sengupta |
| 5,334,958 A | 8/1994 | Babbitt |
| 5,361,403 A | 11/1994 | Dent |
| 5,371,473 A | 12/1994 | Trinh |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,448,252 A | 9/1995 | Ali |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A | 6/1996 | Bradley |
| 5,548,837 A | 8/1996 | Hess et al. |
| 5,561,407 A | 10/1996 | Koscica |
| 5,564,086 A | 10/1996 | Cygan |
| 5,589,844 A | 12/1996 | Belcher et al. |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,721,194 A | 2/1998 | Yandrofski |
| 5,766,697 A | 6/1998 | Sengupta |
| 5,777,581 A | 7/1998 | Lilly |
| 5,778,308 A | 7/1998 | Sroka |
| 5,786,727 A | 7/1998 | Sigmon |
| 5,812,572 A | 9/1998 | King |
| 5,812,943 A | 9/1998 | Suzuki |
| 5,830,591 A | 11/1998 | Sengupta |
| 5,846,893 A | 12/1998 | Sengupta |
| 5,874,926 A | 2/1999 | Tsuru |
| 5,880,635 A | 3/1999 | Satoh |
| 5,886,867 A | 3/1999 | Chivukula |
| 5,892,482 A | 4/1999 | Coleman et al. |
| 5,926,751 A | 7/1999 | Vlahos et al. |
| 5,929,717 A | 7/1999 | Richardson |
| 5,940,030 A | 8/1999 | Hampel et al. |
| 5,963,871 A | 10/1999 | Zhinong |
| 5,969,582 A | 10/1999 | Boesch |
| 5,973,568 A | 10/1999 | Shapiro et al. |
| 5,982,099 A | 11/1999 | Barnes et al. |
| 5,990,766 A | 11/1999 | Zhang |
| 6,008,759 A | 12/1999 | Tangemann et al. |
| 6,009,124 A | 12/1999 | Smith |
| 6,020,787 A | 2/2000 | Kim |
| 6,020,795 A | 2/2000 | Kim |
| 6,029,075 A | 2/2000 | Das |
| 6,045,932 A | 4/2000 | Jia |
| 6,061,025 A | 5/2000 | Jackson |
| 6,064,865 A | 5/2000 | Kuo et al. |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand |
| 6,115,585 A | 9/2000 | Matero |
| 6,125,266 A | 9/2000 | Matero et al. |
| 6,133,868 A * | 10/2000 | Butler ............... H01Q 3/267 342/165 |
| 6,133,883 A | 10/2000 | Munson |
| 6,172,385 B1 | 1/2001 | Duncombe |
| 6,215,644 B1 | 4/2001 | Dhuler |
| 6,242,989 B1 | 6/2001 | Barber |
| 6,266,528 B1 | 7/2001 | Farzaneh |
| 6,281,748 B1 | 8/2001 | Klomsdorf et al. |
| 6,281,847 B1 | 8/2001 | Lee |
| 6,343,208 B1 | 1/2002 | Ying |
| 6,377,142 B1 | 4/2002 | Chiu |
| 6,377,217 B1 | 4/2002 | Zhu |
| 6,377,440 B1 | 4/2002 | Zhu |
| 6,384,785 B1 | 5/2002 | Kamogawa |
| 6,404,614 B1 | 6/2002 | Zhu |
| 6,408,190 B1 | 6/2002 | Ying |
| 6,414,562 B1 | 7/2002 | Bouisse |
| 6,415,562 B1 | 7/2002 | Donaghue |
| 6,438,360 B1 | 8/2002 | Alberth, Jr. et al. |
| 6,452,776 B1 | 9/2002 | Chakravorty |
| 6,461,930 B2 | 10/2002 | Akram |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,556,814 B1 | 4/2003 | Klomsdorf |
| 6,570,462 B2 | 5/2003 | Edmonson |
| 6,590,468 B2 | 7/2003 | du Toit |
| 6,590,541 B1 | 7/2003 | Schultze |
| 6,597,265 B2 | 7/2003 | Liang |
| 6,608,603 B2 | 8/2003 | Alexopoulos |
| 6,624,786 B2 | 9/2003 | Boyle |
| 6,628,962 B1 | 9/2003 | Katsura et al. |
| 6,640,085 B1 | 10/2003 | Chatzipetros |
| 6,657,595 B1 | 12/2003 | Phillips |
| 6,661,638 B2 | 12/2003 | Jackson |
| 6,670,256 B2 | 12/2003 | Yang |
| 6,710,651 B2 | 3/2004 | Forrester |
| 6,724,611 B1 | 4/2004 | Mosley |
| 6,724,890 B1 | 4/2004 | Bareis |
| 6,737,179 B2 | 5/2004 | Sengupta |
| 6,747,522 B2 | 6/2004 | Pietruszynski et al. |
| 6,759,918 B2 | 7/2004 | Du Toit |
| 6,765,540 B2 | 7/2004 | Toncich |
| 6,768,472 B2 | 7/2004 | Alexopoulos |
| 6,774,077 B2 | 8/2004 | Sengupta |
| 6,795,712 B1 | 9/2004 | Vakilian |
| 6,825,818 B2 | 11/2004 | Toncich |
| 6,839,028 B2 | 1/2005 | Lee |
| 6,845,126 B2 | 1/2005 | Dent |
| 6,859,104 B2 | 2/2005 | Toncich |

(56) References Cited

U.S. PATENT DOCUMENTS

| | | |
|---|---|---|
| 6,862,432 B1 | 3/2005 | Kim |
| 6,864,757 B2 | 3/2005 | Du Toit |
| 6,868,260 B2 | 3/2005 | Jagielski |
| 6,882,245 B2 | 4/2005 | Utsunomiya |
| 6,888,714 B2 | 5/2005 | Shaw |
| 6,905,989 B2 | 6/2005 | Ellis |
| 6,906,653 B2 | 6/2005 | Uno |
| 6,907,234 B2 | 6/2005 | Karr |
| 6,914,487 B1 | 7/2005 | Doyle et al. |
| 6,920,315 B1 | 7/2005 | Wilcox et al. |
| 6,943,078 B1 | 9/2005 | Zheng |
| 6,946,847 B2 | 9/2005 | Nishimori |
| 6,949,442 B2 | 9/2005 | Barth |
| 6,961,368 B2 | 11/2005 | Dent et al. |
| 6,964,296 B2 | 11/2005 | Memory |
| 6,965,837 B2 | 11/2005 | Vintola |
| 6,987,493 B2 | 1/2006 | Chen |
| 6,993,297 B2 | 1/2006 | Smith |
| 7,009,455 B2 | 3/2006 | Toncich |
| 7,071,776 B2 | 7/2006 | Forrester |
| 7,106,715 B1 | 9/2006 | Kelton |
| 7,107,033 B2 | 9/2006 | du Toit |
| 7,113,614 B2 | 9/2006 | Rhoads |
| 7,151,411 B2 | 12/2006 | Martin |
| 7,176,634 B2 | 2/2007 | Kitamura |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,298,329 B2 | 11/2007 | Diament |
| 7,299,018 B2 | 11/2007 | Van Rumpt |
| 7,312,118 B2 | 12/2007 | Kiyotoshi |
| 7,332,980 B2 | 2/2008 | Zhu |
| 7,332,981 B2 | 2/2008 | Matsuno |
| 7,339,527 B2 | 3/2008 | Sager |
| 7,426,373 B2 | 9/2008 | Clingman |
| 7,427,949 B2 | 9/2008 | Channabasappa et al. |
| 7,453,405 B2 | 11/2008 | Nishikido et al. |
| 7,468,638 B1 | 12/2008 | Tsai |
| 7,469,129 B2 | 12/2008 | Blaker et al. |
| 7,528,674 B2 | 5/2009 | Kato et al. |
| 7,535,080 B2 | 5/2009 | Zeng et al. |
| 7,535,312 B2 | 5/2009 | McKinzie |
| 7,539,527 B2 | 5/2009 | Jang |
| 7,567,782 B2 | 7/2009 | Liu et al. |
| 7,596,357 B2 | 9/2009 | Nakamata |
| 7,633,355 B2 | 12/2009 | Matsuo |
| 7,642,879 B2 | 1/2010 | Matsuno |
| 7,667,663 B2 | 2/2010 | Hsiao |
| 7,671,693 B2 | 3/2010 | Brobston et al. |
| 7,705,692 B2 | 4/2010 | Fukamachi et al. |
| 7,711,337 B2 | 5/2010 | McKinzie |
| 7,714,676 B2 | 5/2010 | McKinzie |
| 7,714,678 B2 | 5/2010 | du Toit et al. |
| 7,728,693 B2 | 6/2010 | du Toit et al. |
| 7,760,699 B1 | 7/2010 | Malik |
| 7,768,400 B2 | 8/2010 | Lawrence et al. |
| 7,786,819 B2 | 8/2010 | Ella |
| 7,795,990 B2 | 9/2010 | du Toit |
| 7,830,320 B2 | 11/2010 | Shamblin et al. |
| 7,852,170 B2 | 12/2010 | McKinzie |
| 7,856,228 B2 | 12/2010 | Lekutai et al. |
| 7,865,154 B2 | 1/2011 | Mendolia |
| 7,907,094 B2 | 3/2011 | Kakitsu et al. |
| 7,917,104 B2 | 3/2011 | Manssen et al. |
| 7,949,309 B2 | 5/2011 | Rofougaran |
| 7,969,257 B2 | 6/2011 | du Toit |
| 7,983,615 B2 | 7/2011 | Bryce et al. |
| 7,991,363 B2 | 8/2011 | Greene |
| 8,112,043 B2 | 2/2012 | Knudsen et al. |
| 8,170,510 B2 | 5/2012 | Knudsen et al. |
| 8,190,109 B2 | 5/2012 | Ali et al. |
| 8,204,446 B2 | 6/2012 | Scheer |
| 8,213,886 B2 | 7/2012 | Blin |
| 8,217,731 B2 | 7/2012 | McKinzie et al. |
| 8,217,732 B2 | 7/2012 | McKinzie |
| 8,299,867 B2 | 10/2012 | McKinzie |
| 8,320,850 B1 | 11/2012 | Khlat |
| 8,325,097 B2 | 12/2012 | McKinzie, III et al. |
| 8,405,563 B2 | 3/2013 | McKinzie et al. |
| 8,421,548 B2 | 4/2013 | Spears et al. |
| 8,432,234 B2 | 4/2013 | Manssen et al. |
| 8,442,457 B2 | 5/2013 | Harel et al. |
| 8,454,882 B2 | 6/2013 | Chan et al. |
| 8,457,569 B2 | 6/2013 | Blin |
| 8,472,888 B2 | 6/2013 | Manssen et al. |
| 8,478,344 B2 | 7/2013 | Rofougaran et al. |
| 8,543,123 B2 | 9/2013 | Moon et al. |
| 8,543,176 B1 | 9/2013 | Daniel et al. |
| 8,558,633 B2 | 10/2013 | McKinzie, III |
| 8,564,381 B2 | 10/2013 | McKinzie |
| 8,594,584 B2 | 11/2013 | Greene et al. |
| 8,620,236 B2 | 12/2013 | Manssen et al. |
| 8,620,246 B2 | 12/2013 | McKinzie et al. |
| 8,620,247 B2 | 12/2013 | McKinzie et al. |
| 8,655,286 B2 | 2/2014 | Mendolia |
| 8,674,783 B2 | 3/2014 | Spears et al. |
| 8,680,934 B2 | 3/2014 | McKinzie et al. |
| 8,693,963 B2 | 4/2014 | du Toit et al. |
| 8,712,340 B2 | 4/2014 | Hoirup et al. |
| 8,773,019 B2 | 7/2014 | Coumou et al. |
| 8,787,845 B2 | 7/2014 | Manssen et al. |
| 8,803,631 B2 | 8/2014 | Greene et al. |
| 8,860,525 B2 | 10/2014 | Spears et al. |
| 8,948,889 B2 | 2/2015 | Manssen et al. |
| 8,957,742 B2 | 2/2015 | Spears et al. |
| 9,026,062 B2 | 5/2015 | Manssen et al. |
| 9,083,405 B2 | 7/2015 | Christoffersson et al. |
| 9,119,152 B2 | 8/2015 | Blin |
| 9,231,643 B2 | 1/2016 | Hoirup et al. |
| 9,374,113 B2 | 6/2016 | Greene et al. |
| 9,473,194 B2 | 10/2016 | Domino et al. |
| 9,698,858 B2 | 7/2017 | Hoirup et al. |
| 2002/0008672 A1 | 1/2002 | Gothard et al. |
| 2002/0030566 A1 | 3/2002 | Bozler |
| 2002/0079982 A1* | 6/2002 | Lafleur et al. ............... 333/17.1 |
| 2002/0109642 A1 | 8/2002 | Gee et al. |
| 2002/0118075 A1 | 8/2002 | Ohwada |
| 2002/0145483 A1 | 10/2002 | Bouisse |
| 2002/0167963 A1 | 11/2002 | Joa-Ng |
| 2002/0183013 A1 | 12/2002 | Auckland et al. |
| 2002/0187780 A1 | 12/2002 | Souissi |
| 2002/0191703 A1 | 12/2002 | Ling |
| 2002/0193088 A1 | 12/2002 | Jung |
| 2003/0060227 A1 | 3/2003 | Sekine |
| 2003/0071300 A1 | 4/2003 | Yashima |
| 2003/0114124 A1 | 6/2003 | Higuchi |
| 2003/0137464 A1* | 7/2003 | Foti .................. H01P 1/161 343/770 |
| 2003/0142022 A1 | 7/2003 | Ollikainen |
| 2003/0184319 A1 | 10/2003 | Nishimori et al. |
| 2003/0193997 A1 | 10/2003 | Dent |
| 2003/0199286 A1 | 10/2003 | du Toit |
| 2003/0210203 A1 | 11/2003 | Phillips et al. |
| 2003/0210206 A1 | 11/2003 | Phillips et al. |
| 2003/0216150 A1 | 11/2003 | Ueda |
| 2003/0232607 A1 | 12/2003 | Le Bars |
| 2004/0009754 A1 | 1/2004 | Smith, Jr. et al. |
| 2004/0090372 A1 | 5/2004 | Nallo |
| 2004/0100341 A1 | 5/2004 | Luetzelschwab |
| 2004/0125027 A1 | 7/2004 | Rubinshteyn et al. |
| 2004/0127178 A1 | 7/2004 | Kuffner |
| 2004/0137950 A1 | 7/2004 | Bolin |
| 2004/0202399 A1 | 10/2004 | Kochergin |
| 2004/0204027 A1 | 10/2004 | Park et al. |
| 2004/0227176 A1 | 11/2004 | York |
| 2004/0232982 A1 | 11/2004 | Ichitsubo et al. |
| 2004/0257293 A1 | 12/2004 | Friedrich |
| 2004/0263411 A1 | 12/2004 | Fabrega-Sanchez et al. |
| 2005/0007291 A1 | 1/2005 | Fabrega-Sanchez |
| 2005/0032488 A1 | 2/2005 | Pehlke |
| 2005/0032541 A1 | 2/2005 | Wang |
| 2005/0042994 A1 | 2/2005 | Otaka |
| 2005/0059362 A1 | 3/2005 | Kalajo et al. |
| 2005/0082636 A1 | 4/2005 | Yashima |

(56) References Cited

U.S. PATENT DOCUMENTS

| | | |
|---|---|---|
| 2005/0085204 A1 | 4/2005 | Poilasne et al. |
| 2005/0093624 A1 | 5/2005 | Forrester et al. |
| 2005/0130608 A1 | 6/2005 | Forse |
| 2005/0130699 A1 | 6/2005 | Kim |
| 2005/0208960 A1 | 9/2005 | Hassan |
| 2005/0215204 A1 | 9/2005 | Wallace |
| 2005/0227627 A1 | 10/2005 | Cyr et al. |
| 2005/0227633 A1 | 10/2005 | Dunko |
| 2005/0259011 A1* | 11/2005 | Vance ............................ 343/702 |
| 2005/0260962 A1 | 11/2005 | Nazrul et al. |
| 2005/0264455 A1 | 12/2005 | Talvitie |
| 2005/0280588 A1* | 12/2005 | Fujikawa ................ H01Q 1/242 343/702 |
| 2005/0282503 A1 | 12/2005 | Onno |
| 2006/0003537 A1 | 1/2006 | Sinha |
| 2006/0009165 A1 | 1/2006 | Alles |
| 2006/0030277 A1 | 2/2006 | Cyr et al. |
| 2006/0077082 A1 | 4/2006 | Shanks et al. |
| 2006/0099915 A1 | 5/2006 | Laroia et al. |
| 2006/0099952 A1 | 5/2006 | Prehofer et al. |
| 2006/0119511 A1 | 6/2006 | Collinson et al. |
| 2006/0148415 A1 | 7/2006 | Hamalainen et al. |
| 2006/0160501 A1 | 7/2006 | Mendolia |
| 2006/0183431 A1 | 8/2006 | Chang et al. |
| 2006/0183433 A1 | 8/2006 | Mori et al. |
| 2006/0183442 A1 | 8/2006 | Chang et al. |
| 2006/0195161 A1 | 8/2006 | Li et al. |
| 2006/0205368 A1 | 9/2006 | Bustamante |
| 2006/0252391 A1 | 11/2006 | Poilasne et al. |
| 2006/0281423 A1 | 12/2006 | Caimi |
| 2007/0001924 A1* | 1/2007 | Hirabayashi ............ H01Q 19/32 343/893 |
| 2007/0013483 A1 | 1/2007 | Stewart |
| 2007/0035458 A1 | 2/2007 | Ohba |
| 2007/0042725 A1 | 2/2007 | Poilasne |
| 2007/0042734 A1 | 2/2007 | Ryu |
| 2007/0063788 A1 | 3/2007 | Zhu |
| 2007/0077956 A1 | 4/2007 | Julian et al. |
| 2007/0080888 A1 | 4/2007 | Mohamadi |
| 2007/0082611 A1 | 4/2007 | Terranova et al. |
| 2007/0085609 A1 | 4/2007 | Itkin et al. |
| 2007/0091006 A1* | 4/2007 | Thober .................. H01Q 7/005 343/745 |
| 2007/0111681 A1 | 5/2007 | Alberth et al. |
| 2007/0121267 A1 | 5/2007 | Kotani et al. |
| 2007/0142011 A1* | 6/2007 | Shatara ........................ 455/222 |
| 2007/0142014 A1 | 6/2007 | Wilcox |
| 2007/0149146 A1 | 6/2007 | Hwang |
| 2007/0171879 A1 | 7/2007 | Bourque |
| 2007/0182636 A1 | 8/2007 | Carlson |
| 2007/0184825 A1 | 8/2007 | Lim et al. |
| 2007/0194859 A1 | 8/2007 | Brobston et al. |
| 2007/0197180 A1 | 8/2007 | McKinzie et al. |
| 2007/0200766 A1 | 8/2007 | McKinzie |
| 2007/0200773 A1* | 8/2007 | Dou et al. ..................... 343/702 |
| 2007/0210899 A1 | 9/2007 | Kato et al. |
| 2007/0222697 A1 | 9/2007 | Caimi et al. |
| 2007/0248238 A1 | 10/2007 | Abreu et al. |
| 2007/0285326 A1 | 12/2007 | McKinzie |
| 2007/0293176 A1 | 12/2007 | Yu |
| 2008/0007478 A1 | 1/2008 | Jung |
| 2008/0018541 A1 | 1/2008 | Pang |
| 2008/0030165 A1 | 2/2008 | Lisac et al. |
| 2008/0051096 A1 | 2/2008 | Rao et al. |
| 2008/0055016 A1 | 3/2008 | Morris |
| 2008/0055168 A1 | 3/2008 | Massey et al. |
| 2008/0081670 A1 | 4/2008 | Rofougaran |
| 2008/0090539 A1 | 4/2008 | Thompson |
| 2008/0090573 A1 | 4/2008 | Kim et al. |
| 2008/0094149 A1 | 4/2008 | Brobston |
| 2008/0106350 A1 | 5/2008 | McKinzie |
| 2008/0122553 A1 | 5/2008 | McKinzie |
| 2008/0122723 A1 | 5/2008 | Rofougaran |
| 2008/0129612 A1 | 6/2008 | Wang |
| 2008/0158076 A1 | 7/2008 | Walley |
| 2008/0174508 A1* | 7/2008 | Iwai ........................ H01Q 9/30 343/850 |
| 2008/0261544 A1 | 10/2008 | Blin et al. |
| 2008/0266190 A1 | 10/2008 | Ohba et al. |
| 2008/0274706 A1 | 11/2008 | Blin et al. |
| 2008/0285729 A1 | 11/2008 | Glasgow et al. |
| 2008/0288028 A1 | 11/2008 | Larson et al. |
| 2008/0294718 A1 | 11/2008 | Okano |
| 2008/0300027 A1 | 12/2008 | Dou et al. |
| 2008/0305749 A1 | 12/2008 | Ben-Bassat |
| 2008/0305750 A1 | 12/2008 | Alon et al. |
| 2008/0309617 A1 | 12/2008 | Kong et al. |
| 2009/0002077 A1 | 1/2009 | Rohani et al. |
| 2009/0027286 A1* | 1/2009 | Ohishi et al. ................. 343/750 |
| 2009/0039976 A1 | 2/2009 | McKinzie, III |
| 2009/0051611 A1* | 2/2009 | Shamblin ............... H01Q 1/243 343/747 |
| 2009/0082017 A1 | 3/2009 | Chang et al. |
| 2009/0088093 A1 | 4/2009 | Nentwig et al. |
| 2009/0109880 A1 | 4/2009 | Kim et al. |
| 2009/0121963 A1 | 5/2009 | Greene |
| 2009/0149136 A1 | 6/2009 | Rofougaran |
| 2009/0180403 A1 | 7/2009 | Tudosoiu |
| 2009/0184879 A1 | 7/2009 | Derneryd |
| 2009/0196192 A1 | 8/2009 | Lim et al. |
| 2009/0215446 A1 | 8/2009 | Hapsari et al. |
| 2009/0231220 A1 | 9/2009 | Zhang et al. |
| 2009/0253385 A1 | 10/2009 | Dent et al. |
| 2009/0264065 A1 | 10/2009 | Song |
| 2009/0278685 A1 | 11/2009 | Potyrailo |
| 2009/0295651 A1* | 12/2009 | Dou et al. ..................... 343/702 |
| 2009/0323572 A1 | 12/2009 | Shi et al. |
| 2009/0323582 A1 | 12/2009 | Proctor et al. |
| 2010/0041348 A1 | 2/2010 | Wilcox et al. |
| 2010/0053009 A1 | 3/2010 | Rofougaran |
| 2010/0060531 A1 | 3/2010 | Rappaport |
| 2010/0073103 A1 | 3/2010 | Spears et al. |
| 2010/0085260 A1 | 4/2010 | McKinzie |
| 2010/0085884 A1 | 4/2010 | Srinivasan et al. |
| 2010/0105425 A1 | 4/2010 | Asokan |
| 2010/0107067 A1 | 4/2010 | Vaisanen et al. |
| 2010/0134215 A1 | 6/2010 | Lee et al. |
| 2010/0156552 A1 | 6/2010 | McKinzie |
| 2010/0214189 A1 | 8/2010 | Kanazawa |
| 2010/0232474 A1 | 9/2010 | Rofougaran et al. |
| 2010/0244576 A1 | 9/2010 | Hillan et al. |
| 2010/0277363 A1 | 11/2010 | Kainulainen et al. |
| 2010/0285836 A1 | 11/2010 | Horihata et al. |
| 2010/0302106 A1 | 12/2010 | Knudsen et al. |
| 2010/0304688 A1 | 12/2010 | Knudsen et al. |
| 2010/0308933 A1 | 12/2010 | See et al. |
| 2011/0002080 A1 | 1/2011 | Ranta |
| 2011/0012790 A1 | 1/2011 | Badaruzzaman |
| 2011/0012792 A1 | 1/2011 | Krenz |
| 2011/0014879 A1 | 1/2011 | Alberth et al. |
| 2011/0019606 A1 | 1/2011 | Umeda et al. |
| 2011/0026415 A1 | 2/2011 | Kamuf et al. |
| 2011/0039504 A1 | 2/2011 | Nguyen et al. |
| 2011/0043328 A1 | 2/2011 | Bassali |
| 2011/0086600 A1 | 4/2011 | Muhammad |
| 2011/0086630 A1 | 4/2011 | Manssen |
| 2011/0102290 A1 | 5/2011 | Milosavljevic |
| 2011/0105023 A1 | 5/2011 | Scheer et al. |
| 2011/0116395 A1 | 5/2011 | Tsuda et al. |
| 2011/0116423 A1 | 5/2011 | Rousu et al. |
| 2011/0117863 A1 | 5/2011 | Camp, Jr. et al. |
| 2011/0117973 A1 | 5/2011 | Asrani et al. |
| 2011/0121079 A1 | 5/2011 | Lawrence et al. |
| 2011/0122040 A1* | 5/2011 | Wakabayashi ................. 343/833 |
| 2011/0133994 A1* | 6/2011 | Korva ............................ 343/702 |
| 2011/0140982 A1* | 6/2011 | Ozden et al. ................. 343/852 |
| 2011/0183628 A1 | 7/2011 | Baker |
| 2011/0183633 A1 | 7/2011 | Ohba et al. |
| 2011/0195679 A1 | 8/2011 | Lee et al. |
| 2011/0237207 A1* | 9/2011 | Bauder ............................ 455/78 |
| 2011/0249760 A1 | 10/2011 | Chrisikos et al. |
| 2011/0256857 A1 | 10/2011 | Chen et al. |
| 2011/0281532 A1 | 11/2011 | Shin et al. |

(56) References Cited

U.S. PATENT DOCUMENTS

| | | | |
|---|---|---|---|
| 2011/0285511 A1* | 11/2011 | Maguire | G06K 19/0724 340/10.1 |
| 2011/0299438 A1 | 12/2011 | Mikhemar et al. | |
| 2011/0306310 A1 | 12/2011 | Bai | |
| 2011/0309980 A1 | 12/2011 | Ali et al. | |
| 2012/0039189 A1 | 2/2012 | Suzuki et al. | |
| 2012/0051409 A1 | 3/2012 | Brobston et al. | |
| 2012/0062431 A1 | 3/2012 | Tikka et al. | |
| 2012/0075159 A1 | 3/2012 | Chang | |
| 2012/0084537 A1 | 4/2012 | Indukuru et al. | |
| 2012/0094708 A1 | 4/2012 | Park | |
| 2012/0099462 A1 | 4/2012 | Yuda et al. | |
| 2012/0100802 A1 | 4/2012 | Mohebbi | |
| 2012/0112851 A1 | 5/2012 | Manssen | |
| 2012/0112852 A1 | 5/2012 | Manssen et al. | |
| 2012/0119843 A1 | 5/2012 | du Toit et al. | |
| 2012/0119844 A1 | 5/2012 | du Toit et al. | |
| 2012/0214421 A1 | 8/2012 | Hoirup et al. | |
| 2012/0220243 A1 | 8/2012 | Mendolia | |
| 2012/0243579 A1 | 9/2012 | Premakanthan et al. | |
| 2012/0286586 A1 | 11/2012 | Balm | |
| 2012/0293384 A1* | 11/2012 | Knudsen et al. | 343/745 |
| 2012/0295554 A1 | 11/2012 | Greene et al. | |
| 2012/0295555 A1* | 11/2012 | Greene et al. | 455/77 |
| 2012/0309332 A1* | 12/2012 | Liao | H04B 1/401 455/103 |
| 2013/0005277 A1* | 1/2013 | Klomsdorf et al. | 455/77 |
| 2013/0052967 A1 | 2/2013 | Black et al. | |
| 2013/0056841 A1 | 3/2013 | Hsieh et al. | |
| 2013/0076579 A1* | 3/2013 | Zhang et al. | 343/720 |
| 2013/0076580 A1* | 3/2013 | Zhang et al. | 343/720 |
| 2013/0106332 A1 | 5/2013 | Williams et al. | |
| 2013/0122829 A1* | 5/2013 | Hyvonen et al. | 455/77 |
| 2013/0137384 A1 | 5/2013 | Desclos et al. | |
| 2013/0154897 A1 | 6/2013 | Sorensen et al. | |
| 2013/0182583 A1 | 7/2013 | Siomina et al. | |
| 2013/0215846 A1 | 8/2013 | Yerrabommanahalli et al. | |
| 2013/0293425 A1* | 11/2013 | Zhu | H01Q 1/243 343/702 |
| 2013/0315285 A1* | 11/2013 | Black et al. | 375/219 |
| 2014/0002323 A1* | 1/2014 | Ali et al. | 343/852 |
| 2014/0128032 A1 | 5/2014 | Muthukumar et al. | |
| 2016/0241276 A1 | 8/2016 | Zhu et al. | |
| 2016/0269055 A1 | 9/2016 | Greene et al. | |
| 2016/0277129 A1 | 9/2016 | Manssen et al. | |
| 2016/0322991 A1 | 11/2016 | McKinzie | |
| 2016/0336916 A1 | 11/2016 | Du Toit et al. | |
| 2016/0373146 A1 | 12/2016 | Manssen et al. | |
| 2017/0085244 A1 | 3/2017 | Manssen et al. | |

FOREIGN PATENT DOCUMENTS

| | | |
|---|---|---|
| DE | 19614655 | 10/1997 |
| DE | 102008050743 | 4/2010 |
| DE | 102009018648 A1 | 10/2010 |
| EP | 0685936 | 6/1995 |
| EP | 0909024 | 4/1999 |
| EP | 1079296 | 2/2001 |
| EP | 1137192 | 9/2001 |
| EP | 1298810 | 4/2006 |
| EP | 2214085 A2 | 8/2010 |
| EP | 2328233 | 6/2011 |
| EP | 2388925 A1 | 11/2011 |
| EP | 2424119 A1 | 2/2012 |
| EP | 2638640 A4 | 7/2014 |
| EP | 3131157 | 2/2017 |
| JP | 03276901 | 3/1990 |
| JP | 9321526 | 12/1997 |
| JP | 10209722 | 8/1998 |
| JP | 2005-130441 | 5/2005 |
| KR | 100645526 | 11/2006 |
| KR | 10-0740177 | 7/2007 |
| WO | 01/71846 | 9/2001 |
| WO | 2006/031170 | 3/2006 |
| WO | 2008/030165 | 3/2008 |
| WO | WO-2009/064968 | 5/2009 |
| WO | 2009/108391 A1 | 9/2009 |
| WO | 2009/155966 | 12/2009 |
| WO | 2010028521 A1 | 3/2010 |
| WO | 2010121914 A1 | 10/2010 |
| WO | WO-2011/044592 | 4/2011 |
| WO | 2011/084716 | 7/2011 |
| WO | 2011084716 A1 | 7/2011 |
| WO | 2011102143 A1 | 8/2011 |
| WO | WO-2011/133657 | 10/2011 |
| WO | WO-2011028453 | 10/2011 |
| WO | 2012/067622 | 5/2012 |
| WO | 2012/085932 | 6/2012 |
| WO | 2012085932 A2 | 6/2012 |

OTHER PUBLICATIONS

Bezooijen, A. et al., "A GSM/EDGE/WCDMA Adaptive Series-LC Matching Network Using RF-MEMS Switches", IEEE Journal of Solid-State Circuits, vol. 43, No. 10, Oct. 2008, 2259-2268.

Du Toit, , "Tunable Microwave Devices With Auto Adjusting Matching Circuit", U.S. Appl. No. 13/302,617, filed Nov. 22, 2011.

Du Toit, , "Tunable Microwave Devices With Auto-Adjusting Matching Circuit", U.S. Appl. No. 13/302,649, filed Nov. 22, 2011.

Greene, , "Method and Apparatus for Tuning a Communication Device", U.S. Appl. No. 13/108,463, filed May 16, 2011.

Greene, , "Method and Apparatus for Tuning a Communication Device", U.S. Appl. No. 13/108,589, filed May 16, 2011.

Hoirup, , "Method and Apparatus for Radio Antenna Frequency Tuning", U.S. Appl. No. 13/030,177, filed Feb. 18, 2011.

Hyun, S. , "Effects of strain on the dielectric properties of tunable dielectric SrTiO3 thin films", Applied Physics Letters, 2004 American Institute of Physics.

Ida, I. et al., "An Adaptive Impedence Matching System and Its Application to Mobile Antennas", TENCON 2004, IEEE Region 10 Conference, See Abstract ad p. 544, Nov. 21-24, 2004, 543-547.

Manssen, , "Method and Apparatus for Managing Interference in a Communication Device", U.S. Appl. No. 61/326,206, filed Apr. 20, 2010.

Manssen, , "Method and Apparatus for Tuning Antennas in a Communication Device", U.S. Appl. No. 12/941,972, filed Nov. 8, 2010.

Manssen, , "Method and Apparatus for Tuning Antennas in a Communication Device", U.S. Appl. No. 13/005,122, filed Jan. 12, 2011.

McKinzie, , "Adaptive Impedance Matching Module (AIMM) Control Architectures", U.S. Appl. No. 13/293,544, filed Nov. 10, 2011.

McKinzie, , "Adaptive Impedance Matching Module (AIMM) Control Architectures", U.S. Appl. No. 13/293,550, filed Nov. 10, 2011.

McKinzie, , "Method and Apparatus for Adaptive Impedance Matching", U.S. Appl. No. 13/217,748, filed Aug. 25, 2011.

Mendolia, , "Method and Apparatus for Tuning a Communication Device", U.S. Appl. No. 13/035,417, filed Feb. 25, 2011.

Paratek Microwave, Inc., , "Method and Appartus for Tuning Antennas in a Communication Device", International Application No. PCT/US11/59620; Filed Nov. 7, 2011.

Patent Cooperation Treaty, , "International Search Report and Written Opinion", International Application No. PCT/US2010/046241, dated Mar. 2, 2011.

Patent Cooperation Treaty, , "International Search Report and Written Opinion", International Application No. PCT/US2010/056413, dated Jul. 27, 2011.

Patent Cooperation Treaty, , "International Search Report and Written Opinion", dated Nov. 16, 2011, International Application No. PCT/US/2011/038543.

Patent Cooperation Treaty, , "International Search Report and Written Opinion", PCT Application No. PCT/US08/005085, dated Jul. 2, 2008.

(56) References Cited

OTHER PUBLICATIONS

Pervez, N.K., "High Tunability barium strontium titanate thin films for RF circuit applications", Applied Physics Letters, 2004 American Institute of Physics.

Petit, Laurent, "MEMS-Switched Parasitic-Antenna Array for Radiation Pattern Diversity", IEEE Transactions on Antennas and Propagation, vol. 54, No. 9, Sep. 2009, 2624-2631.

Qiao, et al., "Antenna Impedance Mismatch Measurement and Correction for Adaptive COMA Transceivers", IEEE, 2005.

Qiao, et al., "Measurement of Antenna Load Impedance for Power Amplifiers", The Department of Electrical and Computer Engineering, University of California, San Diego, Sep. 13, 2004.

Spears, , "Methods for Tuning an Adaptive Impedance Matching Network With a Look-Up Table", U.S. Appl. No. 13/297,951, filed Nov. 16, 2011.

Stemmer, Susanne, "Low-loss tunable capacitors fabricated directly on gold bottom electrodes", University of California Postprints 2006.

Taylor, T.R., "Impact of thermal strain on the dielectric constant of sputtered barium strontium titanate thin films", Applied Physics Letters, 2002 American Institute of Physics.

Tombak, Ali, "Tunable Barium Strontium Titanate Thin Film Capacitors for RF and Microwave Applications", IEEE Microwave and Wireles Components Letters, vol. 12, Jan. 2002.

Xu, Hongtao, "Tunable Microwave Integrated Circuits using BST Thin Film Capacitors with Device", Integrated Ferroelectrics, Department of Electrical Engineering and Computer Engineering, University of California, 2005.

Zuo, S., "Eigenmode Decoupling for Mimo Loop-Antenna Based on 180 Coupler", Progress in Electromagnetics Research Letters, vol. 26, 2011, 11-20.

Payandehjoo, Kasra et al., "Investigation of Parasitic Elements for Coupling Reduction in MultiAntenna Hand-Set Devices", Published online Jan. 22, 2013 in Wiley Online Library (wileyonlinelibrary.com).

"Extended European Search Report", EP Application No. 16155235.1, dated May 3, 2016.

"Search Report", ROC (Taiwan) Patent Application No. 101117467, English Translation, dated Apr. 12, 2016, 1 page.

"European Search Report", 16151299.1 search report, dated 2016.

Canadian Office Action, Application No. 2,821,173, dated Oct. 17, 2016.

EPO, "Extended European Search Report", EP16188956.3, dated Jan. 9, 2017, 1-9.

Extended European Search Report for 12749235.3 dated Jun. 8, 2017.

Canadian IPO, "Office Action 2,797,074", dated Mar. 10, 2017, 1-3.

\* cited by examiner

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| ⋮ |
| Band N; Use Case 1; Desired tuning state |
| Band N; Use Case 2; Desired tuning state |
| ⋮ |
| Band N; Use Case n; Desired tuning state |

METHODS AND APPARATUS TO CONTROL MUTUAL COUPLING BETWEEN ANTENNAS

FIELD OF THE DISCLOSURE

The subject disclosure relates to methods and apparatus to control mutual coupling between antennas.

BACKGROUND

Cellular telephone devices have migrated to support multi-cellular access technologies, peer-to-peer access technologies, personal area network access technologies, and location receiver access technologies, which can operate concurrently. Cellular telephone devices in the form of smartphones have also integrated a variety of consumer features such as MP3 players, color displays, gaming applications, cameras, and other features. Cellular telephone devices can be required to communicate at a variety of frequencies, and in some instances are subjected to a variety of physical and function use conditions.

BRIEF DESCRIPTION OF THE DRAWINGS

Reference will now be made to the accompanying drawings, which are not necessarily drawn to scale, and wherein:

FIG. 7 depicts an illustrative embodiment of a look-up table utilized by the communication device of FIG. 1 for controlling tunable reactive elements utilized by the communication device;

DETAILED DESCRIPTION

The subject disclosure describes, among other things, illustrative embodiments of a multi-antenna system with a compensation circuit for mitigating the effects of mutual coupling. Other embodiments are contemplated by the subject disclosure.

One embodiment of the subject disclosure includes a communication device includes a first antenna, a second antenna, a tunable compensation circuit, a first circuit coupled to the first antenna, a second circuit coupled to the second antenna, and a controller coupled to the tunable compensation circuit, and the first and second circuits. Responsive to executing computer instructions, the controller can perform operations including causing a transmission of a reference signal from the first antenna, receiving a signal from the second antenna, wherein the signal is associated with the reference signal transmitted by the first antenna, determining from the received signal one or more compensation parameters, and tuning the tunable compensation circuit according to the one or more compensation parameters, wherein the one or more compensation parameters set a variable impedance or variable circuit configuration of the tunable compensation circuit to reduce the mutual coupling between the first and second antennas.

One embodiment of the subject disclosure includes a computer readable storage medium, comprising computer instructions, which when executed by a processor, cause the processor to perform operations including receiving a signal from a first antenna, wherein the signal is associated with a reference signal transmitted by a second antenna, determining from the received signal one or more compensation parameters, and adjusting a compensation circuit including a configurable circuit according to the one or more compensation parameters, where the one or more compensation parameters configure the compensation circuit to reduce the mutual coupling between the first and second antennas.

One embodiment of the subject disclosure includes a method for comparing a received signal from a first antenna to a reference signal transmitted by a second antenna, determining from the comparison one or more compensation parameters, and tuning a compensation circuit according to the one or more compensation parameters, wherein the one or more compensations parameters configure the compensation circuit to reduce mutual coupling between the first and second antennas.

Figure 1:
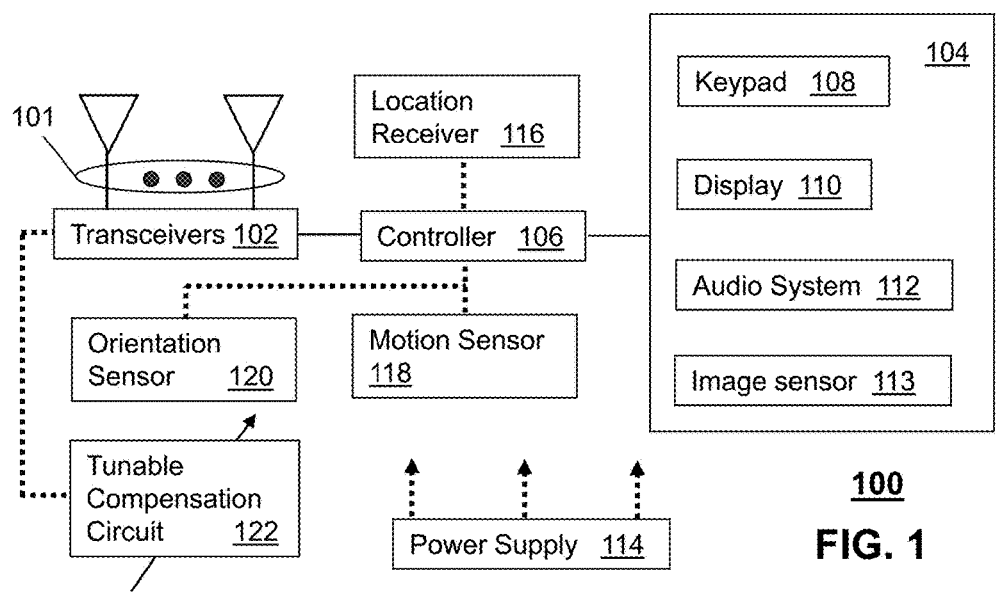
FIG. 1 depicts an illustrative embodiment of a communication device.

FIG. 1 depicts an illustrative embodiment of a communication device 100. The communication device 100 can comprise two or more transceivers 102 of a multi-antenna system 101, each transceiver having transmitter and receiver sections (herein transceivers 102), a tunable compensation circuit 122, a user interface (UI) 104, a power supply 114, a location receiver 116, a motion sensor 118, an orientation sensor 120, and a controller 106 for managing operations thereof. The transceivers 102 can support short-range or long-range wireless access technologies such as Bluetooth, ZigBee, WiFi, DECT, or cellular communication technologies, just to mention a few. Cellular technologies can include, for example, CDMA-1x, UMTS/HSDPA, GSM/GPRS, TDMA/EDGE, EV/DO, WiMAX, SDR, LTE, as well as other next generation wireless communication technologies as they arise. The multi-antenna system 101 can be coupled to the tunable compensation circuit 122 to mitigate the effects of mutual coupling between antennas of the antenna system 101. A portion of the transceivers 102 can also be adapted to support circuit-switched wireline access technologies (such as PSTN), packet-switched wireline access technologies (such as TCP/IP, VoIP, etc.), and combinations thereof.

The UI 104 can include a depressible or touch-sensitive keypad 108 with a navigation mechanism such as a roller ball, a joystick, a mouse, or a navigation disk for manipulating operations of the communication device 100. The keypad 108 can be an integral part of a housing assembly of the communication device 100 or an independent device operably coupled thereto by a tethered wireline interface (such as a USB cable) or a wireless interface supporting, for example, Bluetooth. The keypad 108 can represent a numeric keypad commonly used by phones, and/or a QWERTY keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is touch-sensitive, a portion or all of the keypad 108 can be presented by way of the display 110 with navigation features.

The display 110 can use touch screen technology to also serve as a user interface for detecting user input. As a touch screen display, the communication device 100 can be adapted to present a user interface with graphical user interface (GUI) elements that can be selected by a user with a touch of a finger. The touch screen display 110 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 110 can be an integral part of the housing assembly of the communication device 100 or an independent device communicatively coupled thereto by a tethered wireline interface (such as a cable) or a wireless interface.

The UI 104 can also include an audio system 112 that utilizes audio technology for conveying low volume audio (such as audio heard in proximity of a human ear) and high volume audio (such as speakerphone for hands free operation). The audio system 112 can further include a microphone for receiving audible signals of an end user. The audio system 112 can also be used for voice recognition applications. The UI 104 can further include an image sensor 113 such as a charged coupled device (CCD) camera for capturing still or moving images.

The power supply 114 can utilize common power management technologies such as replaceable and rechargeable batteries, supply regulation technologies, and/or charging system technologies for supplying energy to the components of the communication device 100 to facilitate long-range or short-range portable applications. Alternatively, or in combination, the charging system can utilize external power sources such as DC power supplied over a physical interface such as a USB port or other suitable tethering technologies.

The location receiver 116 can utilize location technology such as a global positioning system (GPS) receiver capable of assisted GPS for identifying a location of the communication device 100 based on signals generated by a constellation of GPS satellites, which can be used for facilitating location services such as navigation. The motion sensor 118 can utilize motion sensing technology such as an accelerometer, a gyroscope, or other suitable motion sensing technology to detect motion of the communication device 100 in three-dimensional space. The orientation sensor 120 can utilize orientation sensing technology such as a magnetometer to detect the orientation of the communication device 100 (north, south, west, and east, as well as combined orientations in degrees, minutes, or other suitable orientation metrics).

The communication device 100 can use the transceivers 102 to also determine a proximity or distance to cellular, WiFi, Bluetooth, or other wireless access points by sensing techniques such as utilizing a received signal strength indicator (RSSI) and/or signal time of arrival (TOA) or time of flight (TOF) measurements. The controller 106 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 100.

Other components not shown in FIG. 1 are contemplated by the subject disclosure. The communication device 100 can include a slot for inserting or removing an identity module such as a Subscriber Identity Module (SIM) card. SIM cards can be used for identifying and registering for subscriber services, executing computer programs, storing subscriber data, and so forth.

The communication device 100 as described herein can operate with more or less of the circuit components shown in FIG. 1. It is further noted that communication device 100 be an integral part of consumer or industrial devices such as cellular phones, computers, laptops, tablets, utility meters, telemetry measurement devices, and so on.

Figure 2:
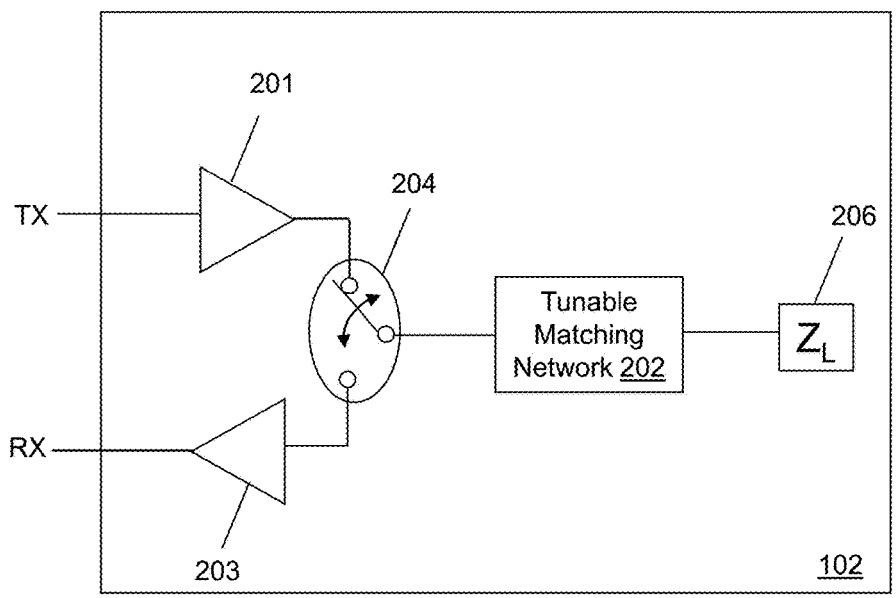
FIG. 2 depicts an illustrative embodiment of a portion of one of a plurality of transceivers of the communication device of FIG. 1.

FIG. 2 depicts an illustrative embodiment of a portion of the wireless transceiver 102 of the communication device 100 of FIG. 1. In GSM applications, the transmit and receive portions of the transceiver 102 can include amplifiers 201, 203 coupled to a tunable matching network 202 that is in turn coupled to an impedance load 206. The impedance load 206 in the present illustration can be one of antennas of the multi-antenna system 101 shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA, UMTS, LTE, and so forth. These undisclosed configurations are applicable to the subject disclosure.

Figure 3:
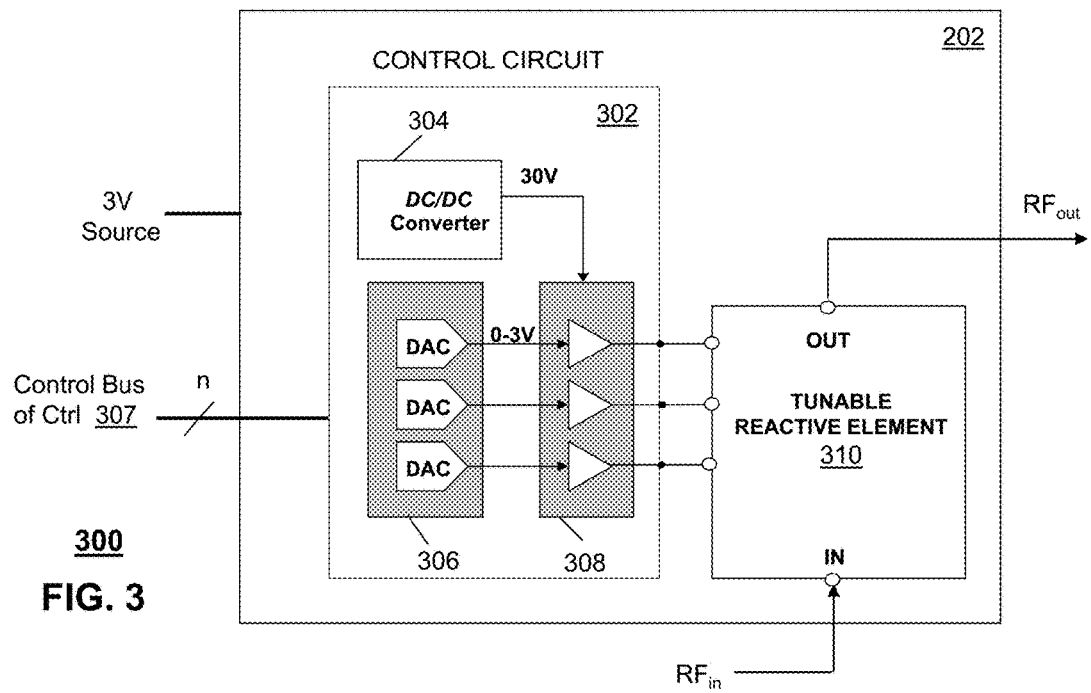
FIGS. 3-6 depict illustrative embodiments of a tunable matching network of the transceiver of FIG. 2.
Figure 4:
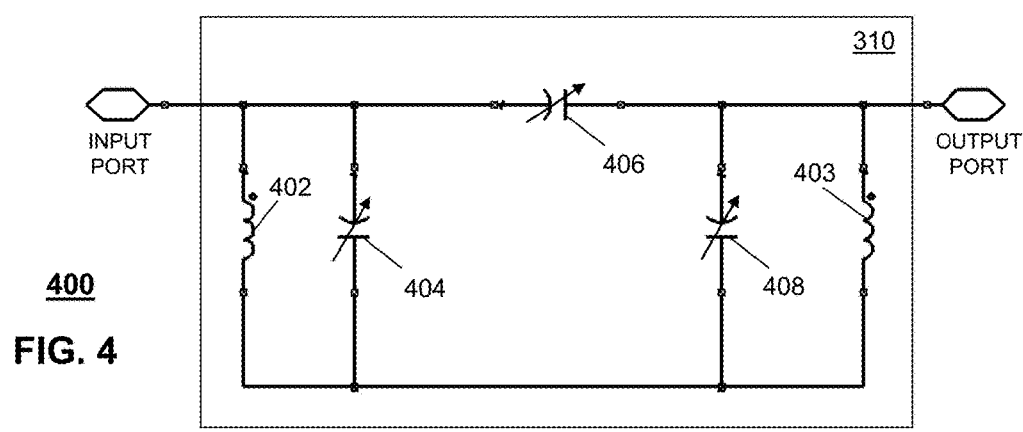

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to one or more tunable reactive components 404, 406 and 408 such as shown in FIG. 4, which depicts a possible circuit configuration for the tunable reactive element 310. In this illustration, the tunable reactive element 310 includes three tunable capacitors 404-408 and two inductors 402-403 with a fixed inductance. Circuit configurations such as "Tee", "Pi", and "L" configurations for a matching circuit are also suitable configurations that can be used in the subject disclosure.

The tunable capacitors 404-408 can each utilize technology that enables tunability of the reactance of the component. One embodiment of the tunable capacitors 404-408 can utilize voltage or current tunable dielectric materials. The tunable dielectric materials can utilize, among other things, a composition of barium strontium titanate (BST). In another embodiment, the tunable reactive element 310 can utilize semiconductor varactors, or micro-electromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 310 of FIG. 3.

The DC-to-DC converter 304 can receive a DC signal such as 3 volts from the power supply 114 of the communication device 100 in FIG. 1. The DC-to-DC converter 304 can use technology to amplify a DC signal to a higher range (e.g., 30 volts) such as shown. The controller 106 can supply digital signals to each of the DACs 306 by way of a control bus 307 of "n" or more wires or traces to individually control the capacitance of tunable capacitors 404-408, thereby varying the collective reactive impedance of the tunable matching network 202. The control bus 307 can be implemented with a two-wire serial bus technology such as a Serial Peripheral Interface (SPI) bus (referred to herein as SPI bus 307). With an SPI bus 307, the controller 106 can transmit serialized digital signals to configure each DAC in FIG. 3. The control circuit 302 of FIG. 3 can utilize digital state machine logic to implement the SPI bus 307, which can direct digital signals supplied by the controller 106 to the DACs to control the analog output of each DAC, which is then amplified by buffers 308. In one embodiment, the control circuit 302 can be a stand-alone component coupled to the tunable reactive element 310. In another embodiment, the control circuit 302 can be integrated in whole or in part with another device such as the controller 106.

Although the tunable reactive element 310 is shown in a unidirectional fashion with an RF input and RF output, the RF signal direction is illustrative and can be interchanged. Additionally, either port of the tunable reactive element 310 can be connected to a feed point of the antenna 206, a structural element of the antenna 206 in an on-antenna configuration, or between antennas for compensating mutual coupling when diversity antennas are used, or when antennas of differing wireless access technologies are physically in close proximity to each other and thereby are susceptible to mutual coupling. The tunable reactive element 310 can also be connected to other circuit components of a transmitter or a receiver section such as filters, power amplifiers, and so on, to control operations thereof.

Figure 6:
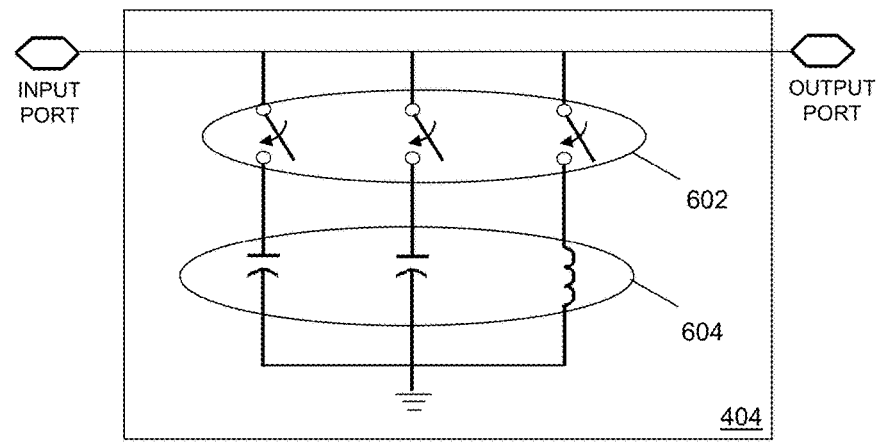

In another embodiment, the tunable matching network 202 of FIG. 2 can comprise a control circuit 502 in the form of a decoder and a tunable reactive element 504 comprising switchable reactive elements such as shown in FIG. 6. In this embodiment, the controller 106 can supply the control circuit 402 signals via the SPI bus 307, which can be decoded with Boolean or state machine logic to individually enable or disable the switching elements 602. The switching elements 602 can be implemented with semiconductor switches, MEMS, or other suitable switching technology. By independently enabling and disabling the reactive elements 607 (capacitor or inductor) of FIG. 6 with the switching elements 602, the collective reactive impedance of the tunable reactive element 504 can be varied by the controller 106.

Figure 5:
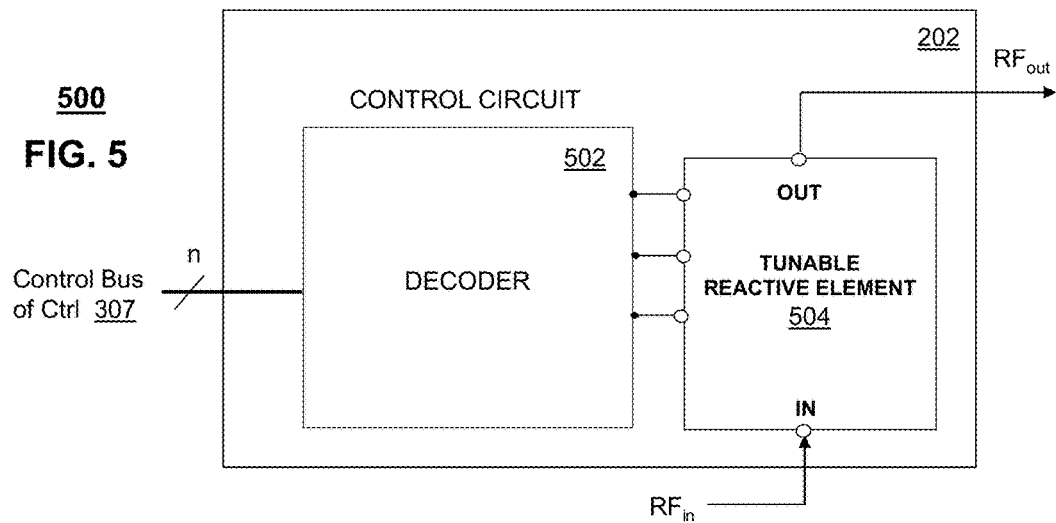

The tunable reactive elements 310 and 504 of FIGS. 3 and 5, respectively, can be used with various circuit components of the transceiver 102 to enable the controller 106 to manage performance factors such as, for example, but not limited to, transmit power, transmitter efficiency, receiver sensitivity, power consumption of the communication device 100, frequency band selectivity by adjusting filter passbands, linearity and efficiency of power amplifiers, specific absorption rate (SAR) requirements, and so on.

Figure 8:
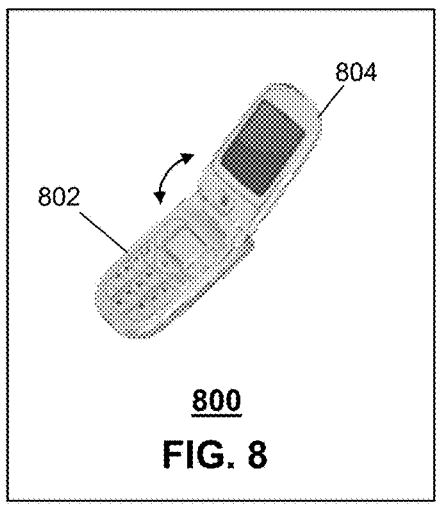
FIGS. 8-11 depict illustrative physical and operational use cases of a communication device.

FIG. 7 depicts an illustration of a look-up table stored in memory, which can be indexed by the controller 106 of the communication device 100 of FIG. 1 according to physical and/or functional use cases of the communication device 100. A physical use case can represent a physical state of the communication device 100, while a functional use case can represent an operational state of the communication device 100. For example, for a flip phone 800 of FIG. 8, an open flip can represent one physical use case, while a closed flip can represent another physical use case. In a closed flip state (i.e., bottom and top flips 802-804 are aligned), a user is likely to have his/her hands surrounding the top flip 802 and the bottom flip 804 while holding the phone 800, which can result in one range of load impedances experienced by an internal or retrievable antenna (not shown) of the phone 800. The range of load impedances of the internal or retrievable antenna can be determined by empirical analysis.

With the flip open a user is likely to hold the bottom flip 802 with one hand while positioning the top flip 804 near the user's ear when an audio system of the phone 800, such audio system 112 of FIG. 1, is set to low volume, and voice channel is active. If, on the other hand, the audio system 112 is in speakerphone mode, it is likely that the user is positioning the top flip 804 away from the user's ear. In these arrangements, different ranges of load impedances can be experienced by the internal or retrievable antenna, which can be analyzed empirically. The low and high volume states of the audio system 112, as well as, a determination that a voice channel is active illustrates varying functional use cases.

Figure 9:
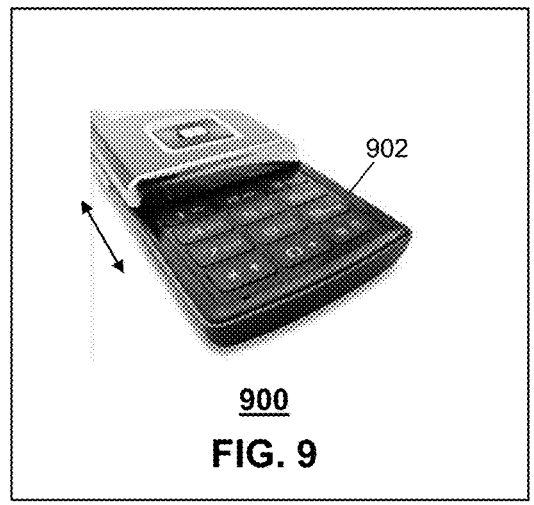
Figure 10:
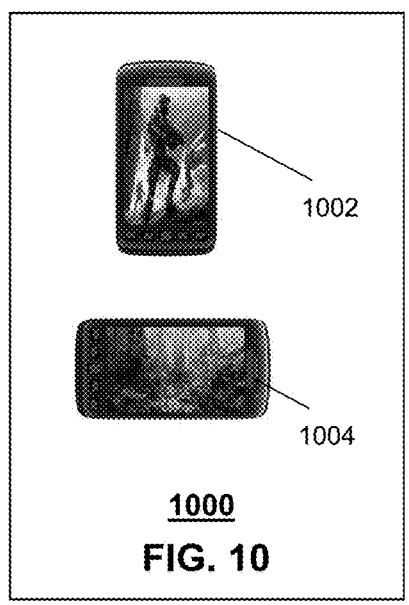
Figure 11:
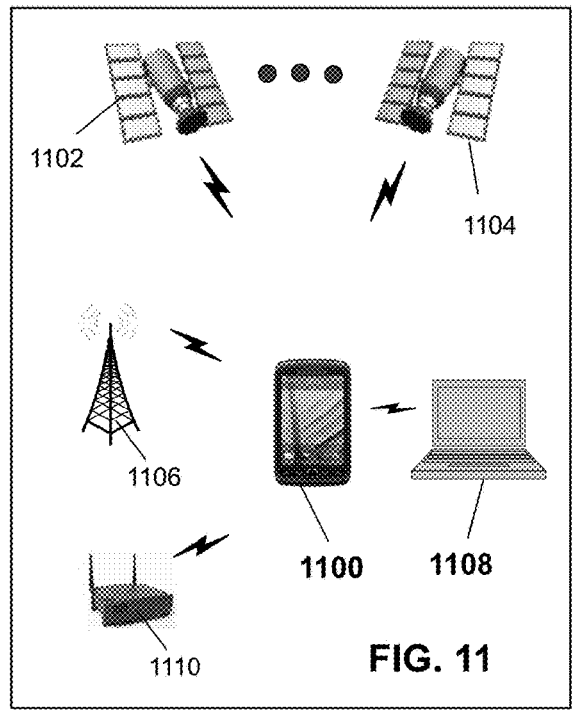

For a phone 900 with a slideable keypad 904 (illustrated in FIG. 9), the keypad in an outward position can present one range of load impedances of an internal antenna(s), while the keypad in a hidden position can present another range of load impedances, each of which can be analyzed empirically. For a smartphone 1000 (illustrated in FIG. 10) presenting a video game, an assumption can be made that the user is likely to hold the phone away from the user's ear in order to view the game. Placing the smartphone 1000 in a portrait position 1002 can represent one physical and operational use case, while utilizing the smartphone 1000 in a landscape position 1004 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 1000 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 1100 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 1100. For example, a multimode phone 1100 that provides GPS services by processing signals received from a constellation of satellites 1102, 1104 can be empirically analyzed when other access technologies are also in use. Suppose, for instance, that while navigation services are enabled, the multimode phone 1100 is facilitating voice communications by exchanging wireless messages with a cellular base station 1106. In this state, an internal antenna of the GPS receiver may be affected by a use case of a user holding the multimode phone 1100 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 1100 (e.g., slider out), which can result in a probable hand position of the user of the multimode phone 1100. Such a physical and functional use case can affect the impedance range of the antenna of the WiFi transceiver as well as the antenna of the GSM transceiver.

A close proximity between the WiFi and GSM antennas and the near operational frequency of the antennas may also result in mutual coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 1108 or with a wireless access point 1110. In diversity designs such as multiple-input and multiple output (MIMO) antennas, physical and functional use cases of a communication device can be measured empirically to determine how best to configure a tunable compensation circuit 122 such as shown in FIG. 1.

The number of physical and functional use cases of a communication device 100 can be substantial when accounting for combinations of access technologies, frequency bands, antennas of multiple access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 102 can also be determined empirically. The empirical data collected and corresponding mitigation strategies can be recorded in the look-up table of FIG. 7 and indexed according to combinations of physical and functional use cases detected by the communication device 100. The information stored in the look-up table can be used in open-loop RF tuning applications to initialize tunable circuit components of the transceiver 102, as well as, tuning algorithms that control operational aspects of the tunable circuit components.

Figure 12:
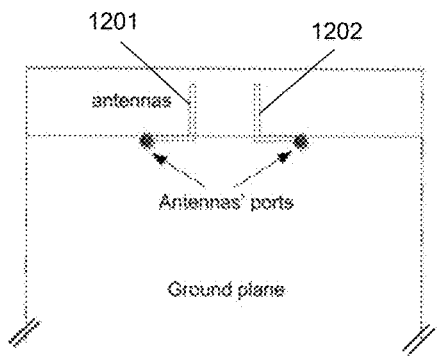
FIGS. 12-13 depict illustrative embodiments of a dual antenna system and the effects of mutual coupling between dual antennas.
Figure 13:
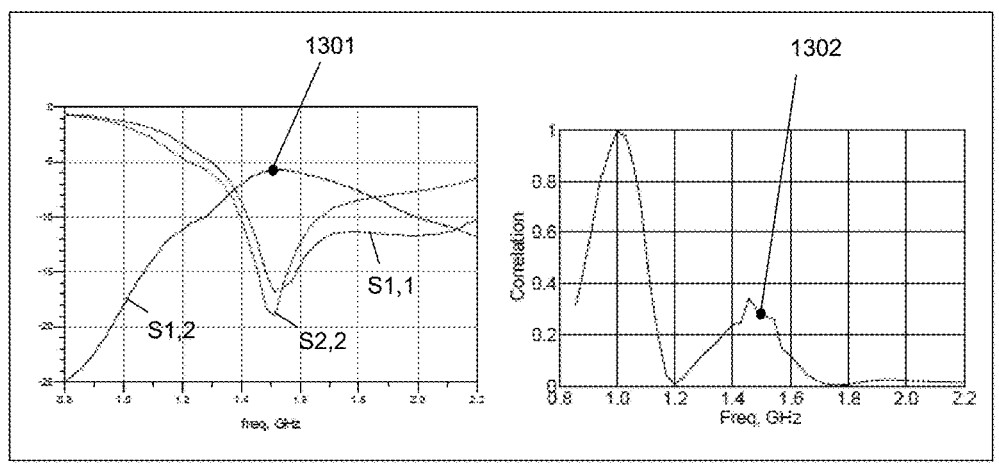

FIGS. 12-13 depict illustrative embodiments of a dual antenna system and the effects of mutual coupling between dual antennas. A limitation in implementing multiple antennas in a communication device such as a mobile phone is the increased coupling that takes place between the antennas as the operating frequency becomes lower and/or as the mobile phone becomes smaller, which results in a close spacing between the antennas 1201 and 1202. In the illustration, two monopole antennas 1201 and 1202 have separation of 0.25, at 1.5 GHz. FIG. 13 shows response plots of antennas 1201 and 1202. From the magnitude and correlation plots of FIG. 13, it is evident that the antennas 1201 and 1202 experience mutual coupling, which measures −6 dB at 1.5 GHz (see reference 1301) having a correlation factor of approximately 0.3 (see reference 1302). Mutual coupling between the antennas results in an overall degradation in system performance.

Figure 14:
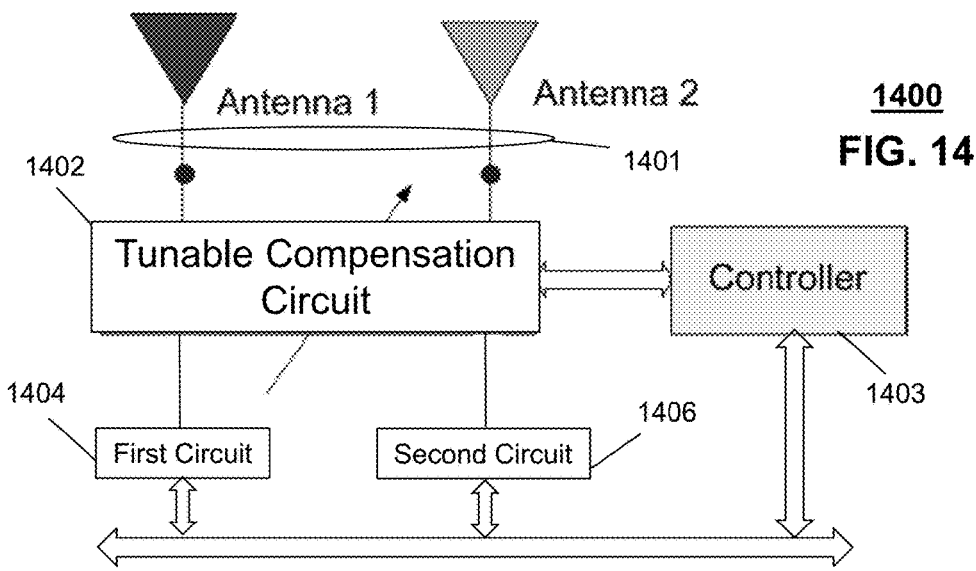
FIGS. 14-16 depict illustrative embodiments of a dual antenna system with a tunable compensation circuit that mitigates the effects of mutual coupling between dual antennas.

FIG. 14 depicts illustrative embodiments of a dual antenna system with a tunable compensation circuit that mitigates the effects of mutual coupling between dual antennas. The tunable compensation circuit 1402 can be controlled with compensation parameters which can be used to tune a configurable reactive component (such as variable capacitors, variable inductors, or combination thereof), a configurable transmission line, a configurable parasitic antenna, or combinations thereof. The controller 1403 can be coupled to the compensation circuit 1402, a first circuit 1404 and a second circuit 1406. The first and second circuits 1404, 1406 can each represent an RF receiver, an RF transmitter, or collectively, an RF transceiver. The controller 1403 can be configured to control operations of the compensation circuit 1402 and the first and second circuits 1404, 1406 with the objective of reducing or substantially eliminating an undesirable signal such as a backscattering current signal resulting from mutual coupling between the antennas, (x). The tunable reactive elements of the compensation circuit 1402 can be controlled as parameters that form the vector x, where x* is a vector of reactive impedance values that achieve an objective to compensate for the mutual coupling between the antennas 1401. The controller 1403 can be configured to generate compensation signals that control the tunable reactive elements of the compensation circuit 1402 to reduce mutual coupling between the antennas 1401.

Figure 15:
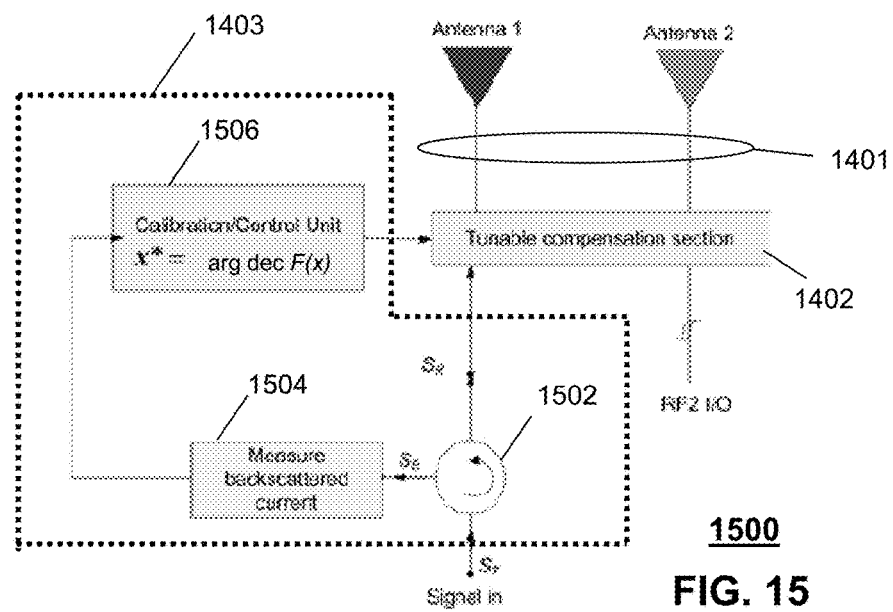
Figure 16:
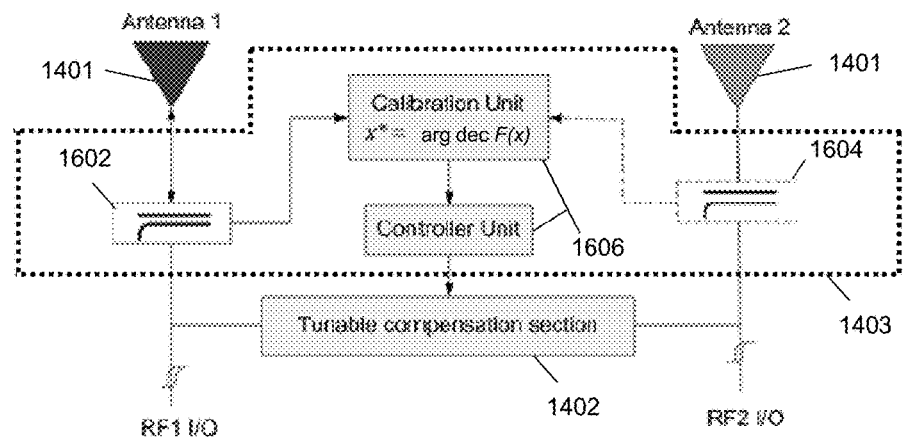

FIGS. 15-16 depict closed-loop sensing techniques that can be employed by the controller 1403 of FIG. 14. For example, in FIG. 15 the controller 1403 can comprise an isolator or circulator component 1502, a backscatter/current sensor 1504, and an algorithm in the form of computer instructions executed by a control unit 1506 configured to decrease or reduce backscatter current measured by sensor 1504 by generating compensation signals that control the tunable reactive elements of the compensation circuit 1402. In FIG. 16, the controller 1403 can comprise a first directional coupler 1602 located at a first antenna of antenna system 1401 and/or a second directional coupler 1604 located at antenna 2 of antenna system 1401. A calibration and control unit combination 1606 can sense signals from one or both directional couplers 1602, 1604, and thereby generate compensation signals that control the tunable reactive elements of the compensation circuit 1402.

Figure 17:
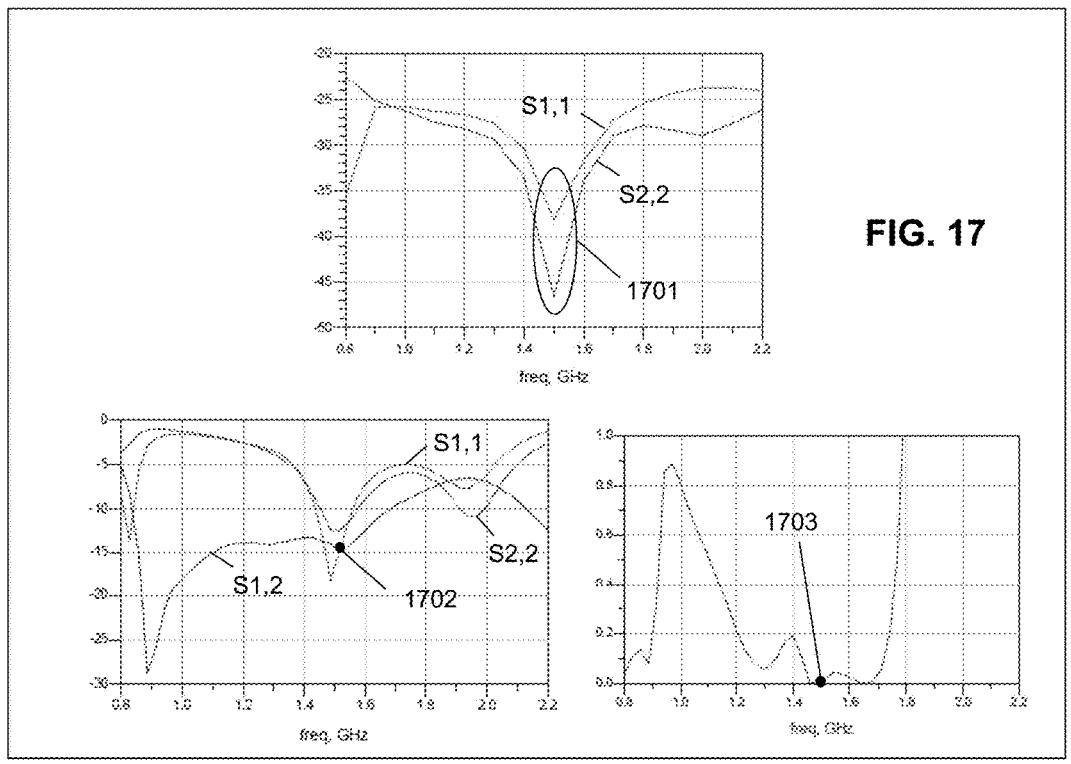
FIG. 17 depicts an illustrative embodiment of a plot of mutual coupling effects mitigated by the tunable compensation circuits of FIGS. 14-16.

Upon sensing coupling current, the controller 1403 can cause the compensation circuit 1402 to reduce the sensed signal as shown in FIG. 17. FIG. 17 shows the coupled currents in both antenna ports minimized at 1.5 GHz (see reference 1701). The magnitude plot shows the mutual coupling between the antennas 1401 noted as S2,1 reduced to −15 dB from an uncompensated value of −6 dB (see FIG. 13), a coupling reduction of 9 dB. With the configurations of FIGS. 14-16, the correlation between the antennas 1401 is minimized to a correlation factor of nearly 0 (see reference 1703).

Figure 18:
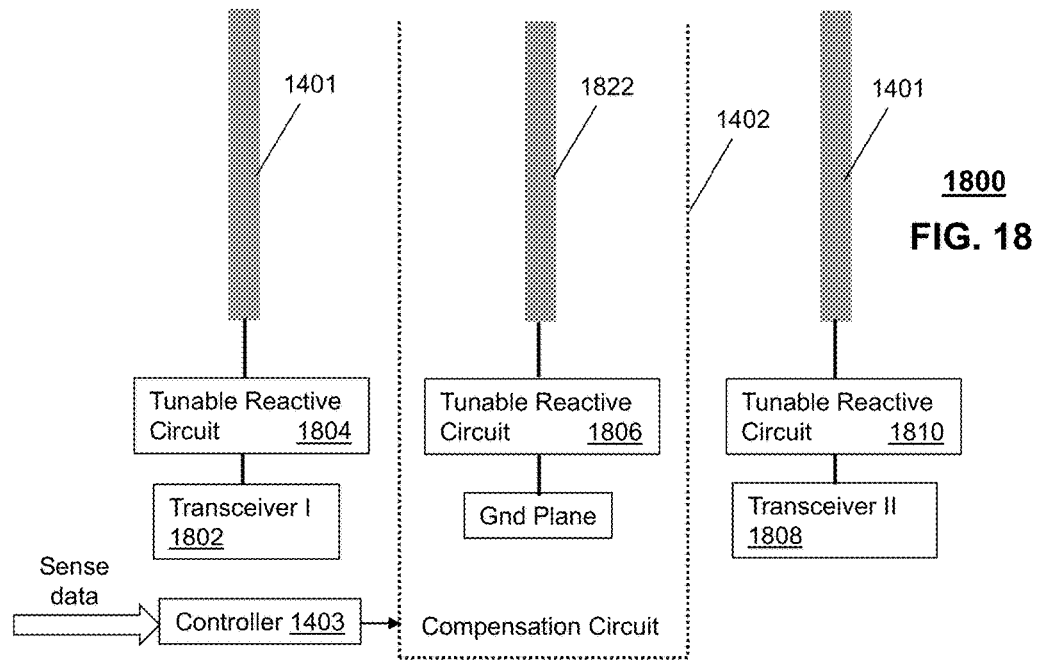
FIGS. 18-19 depict illustrative embodiments of tunable compensation circuit configurations that can be used with a multi-antenna system.
Figure 19:
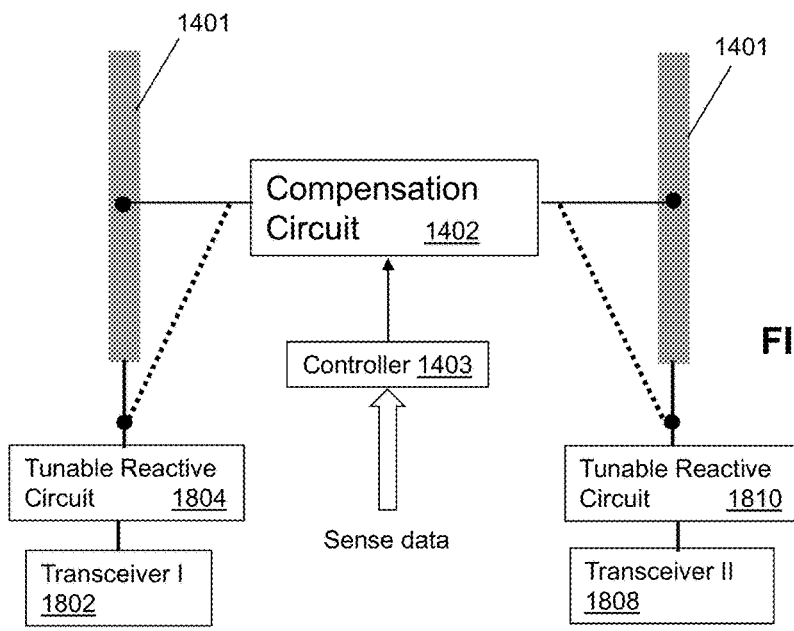

FIGS. 18-19 depict illustrative embodiments of tunable compensation circuit configurations that can be used with multi-antenna systems to reduce the effects of mutual coupling. The tunable compensation circuit 1402 of FIG. 18 comprises a parasitic antenna 1822 coupled to a tunable reactive circuit 1806 connected to a ground plane. The dual system antennas 1401 are coupled to corresponding tunable reactive circuits 1804, 1810, and transceivers 1802, 1808. The tunable compensation circuit 1402 can be configured to operate approximately 180 degrees out of phase of either of the operating frequencies of antennas 1820, 1824. In this configuration, the parasitic antenna 1822 absorbs radiation from either antenna 1820, 1824 and thereby reduces or eliminates mutual coupling. The antennas 1401 can be multi-band antennas configured for low band and high band resonant frequency ranges. The tunable reactive circuit 1806 can be controlled with compensation signals generated by controller 1403 to shift the resonant frequency of the parasitic antenna 1822 in accordance with the operating frequency of antennas 1401 to reduce mutual coupling between the antennas 1401.

Figure 20:
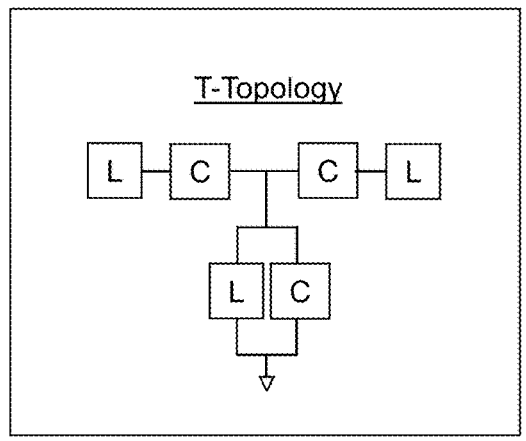
FIGS. 20-22 depict illustrative embodiments of tunable compensation circuits.
Figure 21:
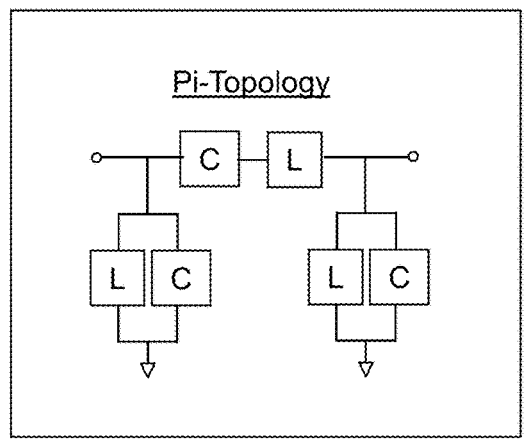
Figure 22:
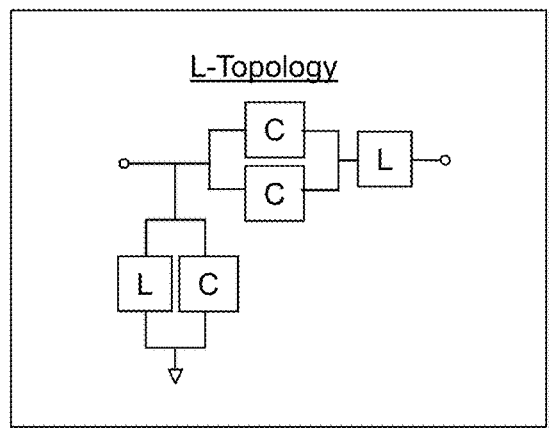

FIG. 19 depicts an embodiment where the compensation circuit 1402 is physically connected to a structural element of antennas 1401 or a feedpoint of the antennas 1401. The compensation circuit 1402 can utilize tunable reactive networks configured as T, Pi, L or other suitable topologies as shown in FIGS. 20-22. Although not shown, some or all of the capacitive or inductive components of FIGS. 20-22 can represent tunable reactive elements. The tunable reactive elements can be based on a number of technologies. For example, tunable reactive elements can utilize an array of fixed reactive elements controlled by semiconductor or MEMS devices to produce a variable reactance. Tunable reactive elements can also be based on variable reactive elements controlled by MEMS devices, or variable reactive elements controlled by a signal that varies a dielectric constant of the variable reactive elements to produce a variable reactance. Other technologies that support a tunable reactance can be utilized.

Figure 23:
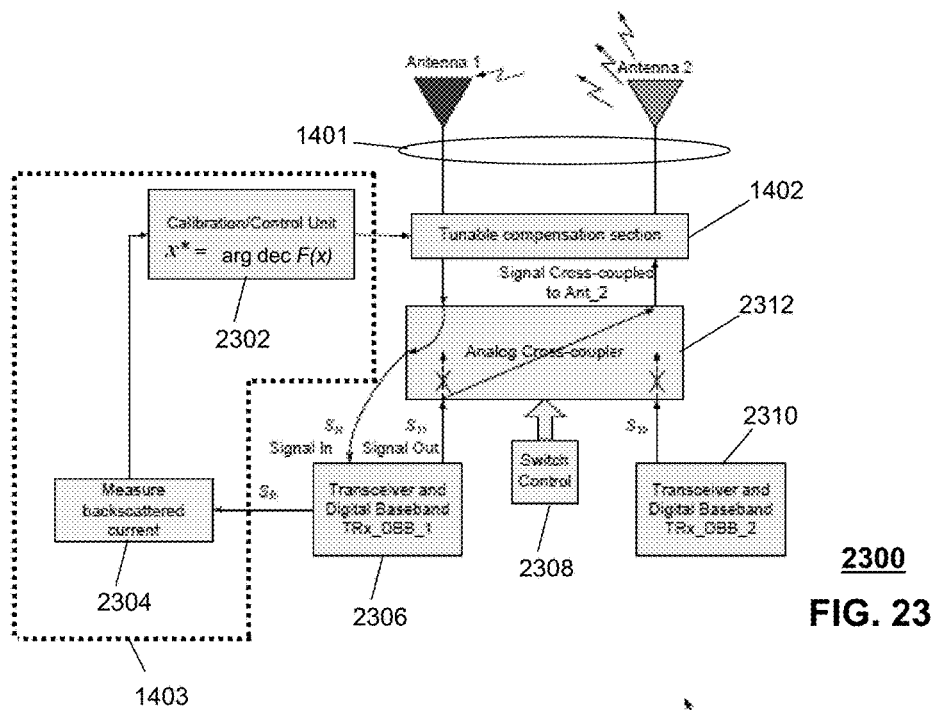
FIGS. 23-24 depict illustrative embodiments of strategies to mitigate mutual coupling in multi-antenna systems with compensation circuits.
Figure 24:
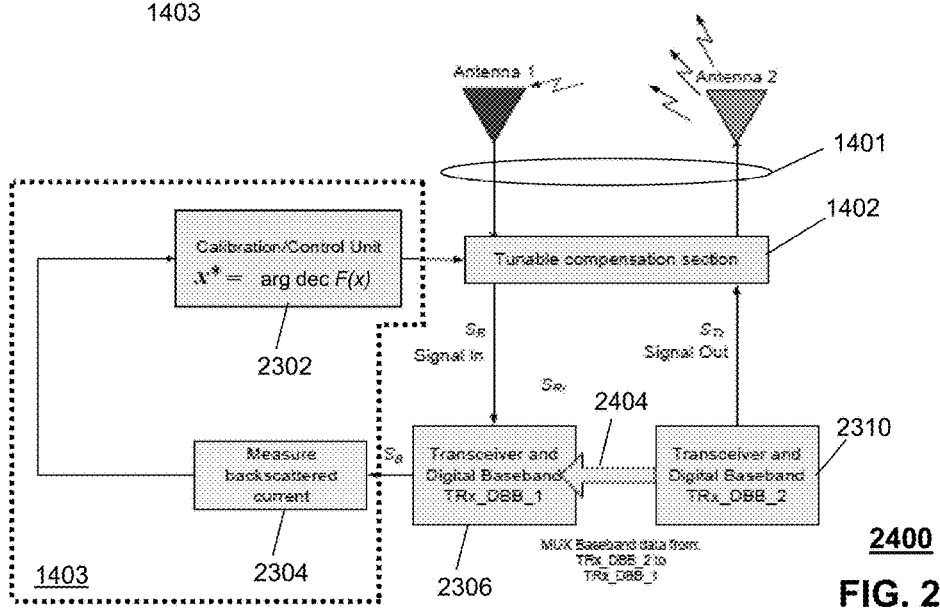
Figure 25:
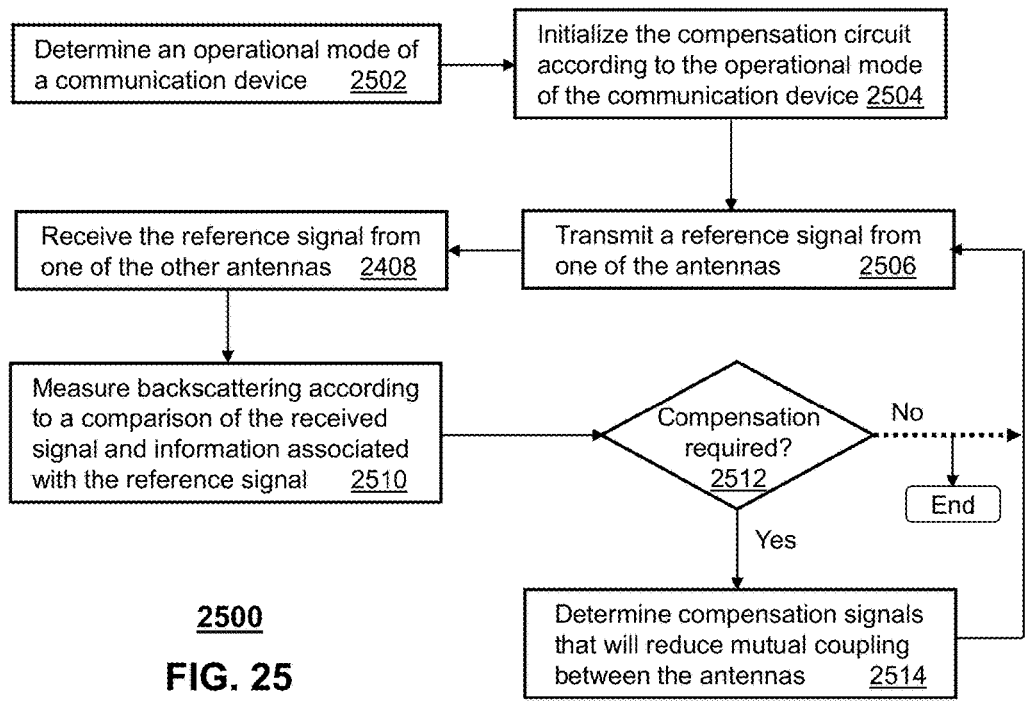
FIG. 25 depicts an exemplary method that can be used by the devices depicted in FIGS. 23-24.

FIGS. 23-24 depict illustrative embodiments of strategies to mitigate mutual coupling in dual antenna systems with compensation circuits. FIG. 25 depicts an exemplary method that can be used by the devices depicted in FIGS. 23-24. Method 2500 can begin with step 2502 where a controller 1403 determines an operational mode of a communication device utilizing the multi-antenna transceiver configurations of FIG. 23 or 24. The operational mode of the communication device can be determined from physical and functional characteristics of the communication device such as flip open, flip closed, slider in, slider out, a particular high band frequency in use, and so on, as noted in the discussions of FIGS. 7-11.

Each of the combinations of physical and functional characteristics can be empirically analyzed according to its effect on mutual coupling between antennas 1401. According to the empirical analysis, the look-up table of FIG. 7 can be populated with recommended compensation values for initializing the compensation circuit 1402 to reduce mutual coupling between antennas 1401. Base on the determined operational mode of the communication device in step 2502, the controller 1403 can proceed to step 2504 where it retrieves from the look-up table of FIG. 7 compensation values that are supplied to the compensation circuit 1402 to establish an initial compensation state. Steps 2502 and 2504 can represent an open-loop portion of a mutual coupling algorithm since these steps do not require a measure of backscatter currents.

To further reduce mutual coupling between antennas 1401, the controller 1403 can be configured with executable compute instructions to perform steps 2506 through 2514 which represent a closed-loop portion of the mutual coupling algorithm. At step 2506 the controller 1403 can cause a first transceiver 2306 to transmit a reference signal from a second antenna 1401 after the analog cross-coupler 2312 is configured by switch 2308 to connect the first transceiver 2306 to the second antenna 1401. The reference signal in turn is received by a first antenna 1401 at step 2408. The first transceiver 2306 can pass the received signal along with information about the reference signal to a backscatter current sensor 2304 which compares at step 2510 the known reference signal with the receives signal. The backscatter current sensor 2304 provides to the calibration unit 2302 a measure of backscatter current determined from a comparison of the received signal to information relating to the reference signal. The backscatter current sensor 2304 can perform this function digitally with software executed by a processor if the received signal and reference signal provided by the first transceiver 2306 is in a digital format, or as an analog circuit if the reference signal and the received signal are provided by the first transceiver 2306 in an analog format.

The calibration unit 2302 determines at step 2512 whether the measure of backscatter current requires a change in the compensation signals. If a change is required because, for example, the measure of backscatter current exceeds a desired threshold, then the controller 1403 proceeds to step 2514 where it determines the compensation signals required to further reduce mutual coupling between the antennas 1401. As noted earlier, the compensation signals cause a change in reactance of the tunable compensation circuit 1402 which can reduce mutual coupling between the antennas 1401. The controller 1403 supplies the compensation signals to the tunable compensation circuit 1402 at step 2506. The closed-loop algorithm continues to tune the tunable compensation circuit 1402 by repeating steps 2506-2514 until a suitable reduction of mutual coupling has been achieved. If the controller 1403 determines at step 2512 that compensation is not required, the controller 1403 periodically repeat steps 2506-2512 to monitor mutual coupling between the antennas 1401 to compensation for future changes. Between monitoring cycles, the controller 1403 may cease to engage the algorithm as depicted by the "end" statement.

FIG. 24 depicts another embodiment where by a second transceiver 2310 causes a transmission of the reference signal by way of the second antenna 1401 and provides information about the reference signal by way of a bus 2404 to the first transceiver 2306. By utilizing the second transceiver 2310, one can avoid the use of a switch 2308 and analog coupler 2312 as shown in FIG. 23. Method 2500 can also be applied to the configuration of FIG. 24.

Upon reviewing the aforementioned embodiments, it would be evident to an artisan with ordinary skill in the art that said embodiments can be modified, reduced, or enhanced without departing from the scope and spirit of the claims described below. For example, the apparatus and methods described above can be applied to any communication device type utilizing a multi-antenna configuration. Such communication device may not be portable such as, for example, fixed-location base station, a WiFi router, and so on. In one embodiment, method 2500 can be adapted to compensate for mutual coupling between more than two antennas. For example, method 2500 can be adapted to compensate for two antennas that are mutually coupled to a third antenna. Furthermore, the embodiments described above can be applied in instances where antennas of different access technologies interfere with each other in a non-diversity configuration (e.g., Bluetooth interference with WiFi, WiFi interfering with a cellular band, etc.). Method 2500 can be configured to use active communication sessions as a source for the RF reference signal depicted in FIGS. 23-24. Alternatively, method 2500 can be configured to generate RF reference signals at very low amplitudes when communication sessions are not active.

Figure 26:
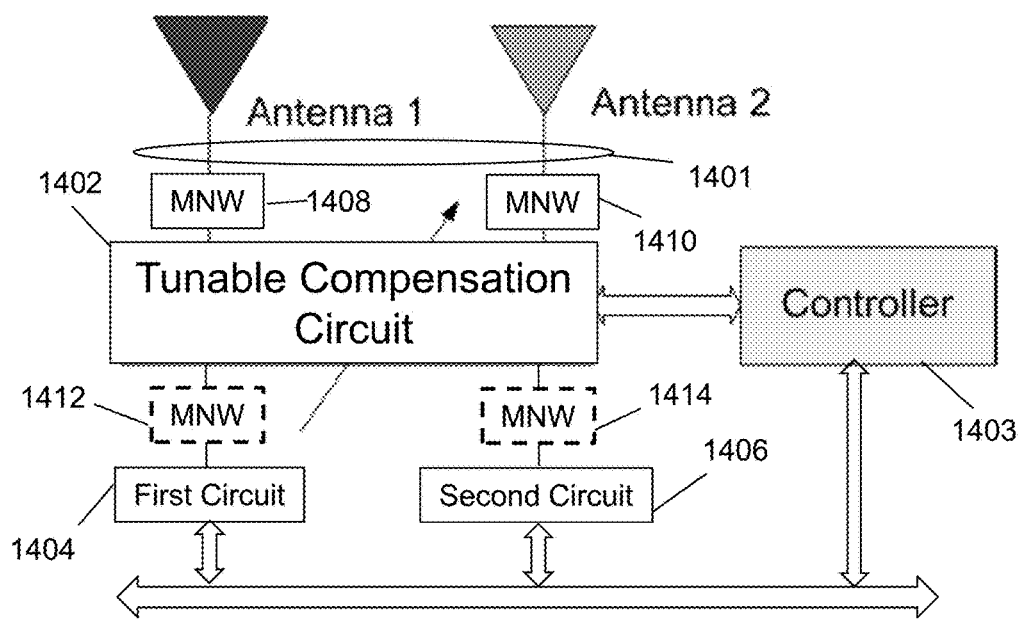
FIG. 26 depicts an illustrative supplemental embodiment of the dual antenna system of FIG. 14.

In one embodiment, the dual antenna system of FIG. 14 can be modified to include a matching network at or downstream of the antenna system 1401 as shown in FIG. 26. In this embodiment, matching networks 1408, 1410 can be placed at or near a feedpoint of the antennas 1401, or on a structural portion of the antennas 1401. The matching networks 1408, 1410 can have a fixed impedance, or a tunable impedance configurable by the controller 1403 in a manner such as described above in the illustrations of FIGS. 2-6. In another embodiment, matching networks 1412, 1414 can be placed between the tunable compensation circuit 1402 and the first and second circuits 1404, 1406. The matching networks 1412, 1414 in this embodiment can have a fixed impedance, or a tunable impedance configurable by the controller 1403. In one embodiment, the controller 1403 can comprise a plurality of processors for executing the algorithms described in the subject disclosure. For example, the controller 1403 can include first and second processors, whereby the first processor executes an algorithm for tuning a match, and the second processor executes an algorithm for compensating for mutual coupling. The algorithms for tuning a match and for compensating for mutual coupling can be configured to share information with each other to achieve the objectives set forth in each algorithm. For example, the matching algorithm can set a flag indicating to the compensation algorithm that it may begin to execute. Other embodiments for sharing information and processing shared information are possible and therefore contemplated by the subject disclosure.

In one embodiment where the matching networks 1408, 1410 are tunable, method 2500 can be modified so that the controller 1403 is programmed to tune the matching networks 1408, 1410 to substantially reduce reflected signals from the antennas 1401 to achieve a desirable match. Once a match is achieved, the controller 1403 can perform the compensation steps shown in FIG. 25. In another embodiment where the matching networks 1408, 1410 have a fixed impedance, method 2500 can be modified so that the controller 1403 is programmed to determine from a look-up table (such as shown in FIG. 7) expected reflected signals from the antenna system 1401 based on a mode of operation of a communication device 100 utilizing the circuit configuration of FIG. 26 (see the descriptions relating to FIGS. 8-11). Since the mode of operation of the communication device 100 can be empirically analyzed, it is possible to predict reflected signals from the antenna system 1401 and record such predictions in the look-up table of FIG. 7. Knowing the expected reflected signals, the controller 1403 can be programmed to remove in whole or in part an error caused by the reflected signals when calculating the compensation parameters of the compensation circuit 1402. Based on this approach, the controller 1403 can be programmed to perform the steps of FIG. 25 to compensate for mutual coupling between the antennas 1401.

In an embodiment that utilizes matching networks 1412, 1414 where such matching networks are tunable, method 2500 can be adapted so that the controller 1403 determines the mode of operation of the communication device 100, and determines from the look-up table expected reflected signals from the antenna system 1401 based on the compensation parameters used and the mode of operation of the communication device 100. With this information, the controller 1403 can be programmed to tune the matching networks 1412, 1414 to reduce the reflected signals to a desirable match. Once the match is accomplished, the controller 1403 can perform the steps of FIG. 25 to reduce mutual coupling in the antenna system 1401.

In an embodiment where the matching networks 1412, 1414 have a fixed impedance, the controller 1403 can be programmed to determine from the look-up table expected reflected signals from the antenna system 1401 based on the compensation parameters being used to tune the tunable compensation circuit 1402. With this information, the controller 1403 can be programmed to remove from the measured backscattering current signal the expected reflected signals and thereby determine compensation parameters for tuning the compensation circuit to reduce mutual coupling in the antenna system 1401. In one embodiment, all four matching networks (1408, 1410, 1412, and 1414) of FIG. 26 can be used, and each matching network having a fixed-impedance or tunable impedance. In this embodiment, the look-up table can be used, among other things, to account for expected reflected signals when calculating compensation parameters based on the operating mode of the communication device 100.

In yet another embodiment, method 2500 can be adapted to reduce mutual coupling in the antenna system 1401 when matching networks are not used. In this embodiment, the controller 1403 can be programmed to determine from the look-up table expected reflected signals from the antenna system 1401 based on the mode of operation of the communication device 100. The information relating to the reflected signals can be used by the controller 1403 to adjust backscattering current measurements, thereby enabling the controller 1403 to perform the steps of FIG. 25 to reduce mutual coupling in the antenna system 1401.

Other embodiments are contemplated by the subject disclosure.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intervening processing device).

Figure 27:
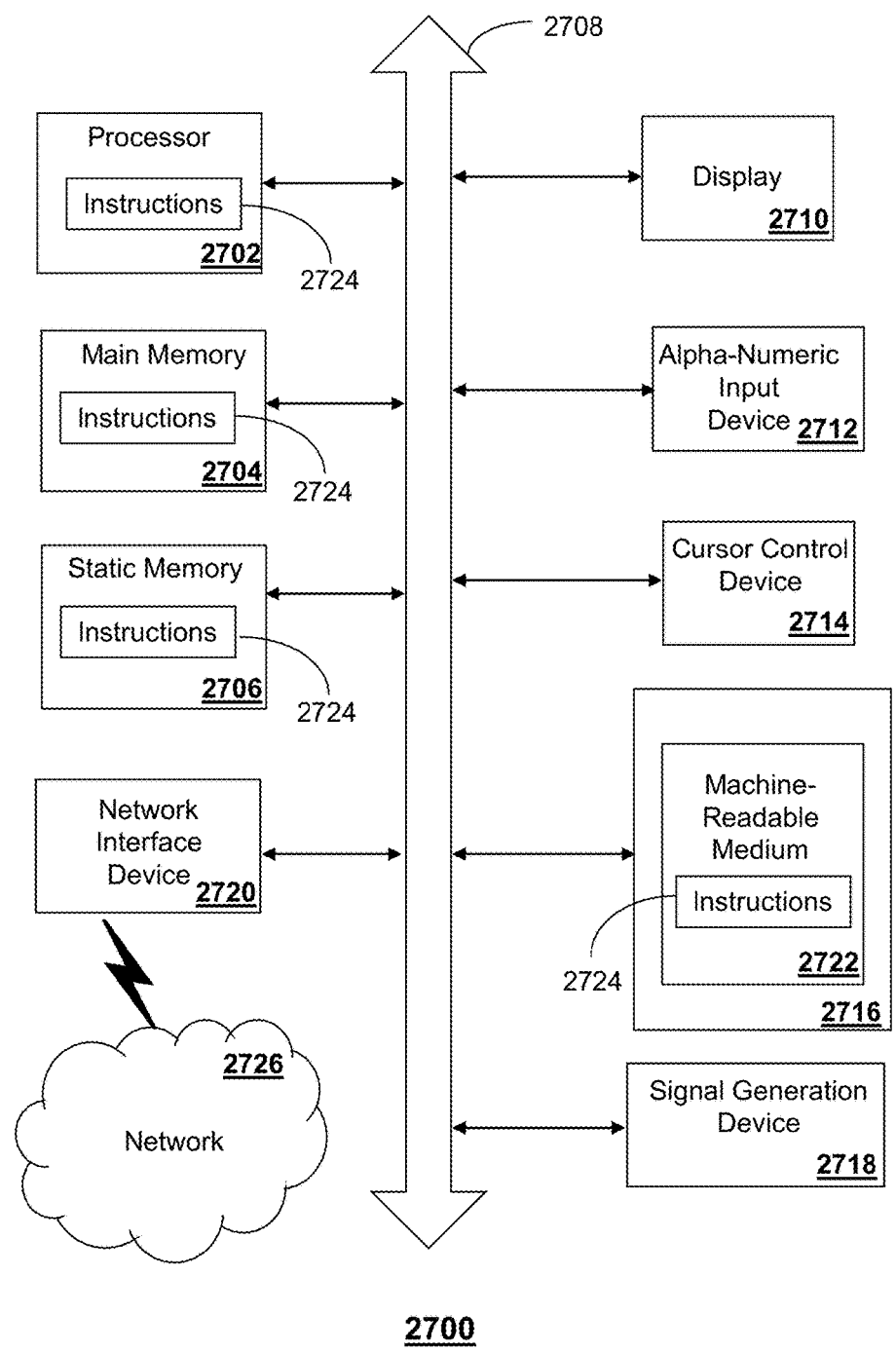
FIG. 27 depicts an illustrative diagrammatic representation of a machine in the form of a computer system within which a set of instructions, when executed, may cause the machine to perform any one or more of the methodologies disclosed herein.

FIG. 27 depicts an exemplary diagrammatic representation of a machine in the form of a computer system 2700 within which a set of instructions, when executed, may cause the machine to perform any one or more of the methods discussed above. One or more instances of the machine can operate, for example, the communication device 100 of FIG. 1 as well as the devices of FIGS. 8-11. In some embodiments, the machine may be connected (e.g., using a network 2726) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 2700 may include a processor (or controller) 2702 (e.g., a central processing unit (CPU), a graphics processing unit (GPU, or both), a main memory 2704 and a static memory 2706, which communicate with each other via a bus 2708. The computer system 2700 may further include a display unit 2710 (e.g., a liquid crystal display (LCD), a flat panel, or a solid state display. In distributed environments, the embodiments described in the subject disclosure can be adapted to utilize multiple display units 2710 controlled by two or more computer systems 2700. In this configuration, presentations described by the subject disclosure may in part be shown in a first of the display units 2710, while the remaining portion is presented in a second of the display units 2710. The computer system 2700 may include an input device 2712 (e.g., a keyboard), a cursor control device 2714 (e.g., a mouse), a disk drive unit 2716, a signal generation device 2718 (e.g., a speaker or remote control) and a network interface device 2720.

The disk drive unit 2716 may include a tangible computer-readable storage medium 2722 on which is stored one or more sets of instructions (e.g., software 2724) embodying any one or more of the methods or functions described herein, including those methods illustrated above. The instructions 2724 may also reside, completely or at least partially, within the main memory 2704, the static memory 2706, and/or within the processor 2702 during execution thereof by the computer system 2700. The main memory 2704 and the processor 2702 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 622 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 2700.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A communication device, comprising:
a first antenna;
a first matching network coupled to the first antenna, the first matching network including a first tunable reactance;
a second antenna;
a second matching network coupled to the second antenna, the second matching network including a second tunable reactance;
a tunable compensation circuit comprising a parasitic antenna element coupled to a tunable reactive circuit, wherein the parasitic antenna element absorbs radiation from the first antenna, the second antenna or both, wherein the radiation absorbed by the tunable compensation circuit, by way of the parasitic antenna element, reduces a mutual coupling between the first antenna and the second antenna;
a first circuit coupled to the first antenna;
a second circuit coupled to the second antenna; and
a controller in communication with the tunable compensation circuit, the first matching network and the second matching network, the first and second circuits, wherein responsive to executing instructions, the controller facilitates performance of operations comprising:
adjusting the first and second tunable reactances to perform impedance matching for the first and second antennas;
facilitating a transmission of a reference signal from the second antenna resulting from connecting the first circuit to the second antenna;
receiving a signal at the first antenna to obtain a received signal, wherein the signal is associated with the reference signal transmitted from the second antenna;
determining a backscatter current from a comparison of the received signal to the reference signal; and
responsive to the backscatter current exceeding a backscatter current threshold:
tuning the tunable compensation circuit by setting a variable impedance or variable circuit configuration of the tunable compensation circuit to reduce the mutual coupling between the first and second antennas,
wherein the tuning of the tunable compensation circuit comprises controlling the tunable reactive circuit to adjust a resonant frequency of the parasitic antenna element, thereby reducing the mutual coupling between the first antenna and the second antenna, and is performed responsive to a determination that the adjusting of the first and second tunable reactances satisfies an impedance matching threshold.

2. The communication device of claim 1, further comprising:
a cross-coupler coupled between the first and second antennas and the first and second circuits and in communication with the controller,
wherein the first circuit comprises a first radio frequency transceiver comprising a first transmitter portion and a first receiver portion,
wherein the second circuit comprises a second radio frequency receiver portion comprising a second transmitter portion and a second receiver portion, and
wherein the cross-coupler, responsive to receiving a signal from the controller, temporarily couples the first transmitter portion to the second antenna to facilitate the transmission of the reference signal from the second antenna.

3. The communication device of claim 1, wherein the tunable compensation circuit is connected to a first feed point of the first antenna, a second feed point of the second antenna, or both.

4. The communication device of claim 1, wherein the tunable compensation circuit is connected to a first structural element of the first antenna, a second structural element of the second antenna, or both.

5. The communication device of claim 1, wherein the tunable reactive circuit is controlled to produce a phase difference of about 180 degrees between the parasitic antenna element and the first antenna, the second antenna or both.

6. The communication device of claim 5, wherein the parasitic antenna element is connected to a first structure of the first antenna, a second structure of the second antenna, or both.

7. The communication device of claim 5, wherein the parasitic antenna element is not connected to a first structural element of the first antenna, a second structural element of the second antenna, or both.

8. The communication device of claim 5, wherein the parasitic antenna element is coupled to ground via the tunable reactive circuit.

9. The communication device of claim 1, wherein the operations further comprise:
receiving, from the first circuit, information to obtain received information relating to the reference signal;
comparing the received information to the received signal to obtain a comparison; and
determining a compensation parameter from the comparison, wherein the tunable compensation circuit is tuned in accordance with the compensation parameter.

10. The communication device of claim 1, comprising a switch, wherein the first and second circuits are coupled to the first and second antennas by way of the switch, and wherein the facilitating of the transmission of the reference signal from the first antenna comprises causing the switch to couple one of the first circuit or the second circuit to the first antenna to transmit the reference signal from the first antenna.

11. The communication device of claim 1, wherein the operations further comprise:
supplying, from the first circuit to the second circuit, information to obtain supplied information relating to the reference signal;
comparing the supplied information to the received signal to obtain a comparison; and
determining a compensation parameter from the comparison, wherein the tunable compensation circuit is tuned in accordance with the compensation parameter.

12. The communication device of claim 1, comprising a sensor, wherein the receiving of the signal comprises receiving the signal from the sensor.

13. The communication device of claim 12, wherein the sensor comprises one of a circulator device or a directional coupler, and wherein the sensor supplies to the controller, analog or digital signals representative of the received signal.

14. The communication device of claim 12, wherein the determining of the backscatter current comprises:
sensing by way of the sensor a reflected signal;
substantially removing the reflected signal from the received signal to generate an updated received signal; and
determining the backscatter current from the updated received signal.

15. The communication device of claim 1, wherein a compensation parameter determined from the backscatter current tunes a tunable element of the tunable compensation circuit to control the variable impedance of the tunable compensation circuit, and wherein the tunable element comprises at least one fixed reactive element controlled by at least one semiconductor device to produce a variable reactance.

16. The communication device of claim 1, wherein a compensation parameter determined from the backscatter current tunes a tunable element of the tunable compensation circuit to control the variable impedance of the tunable compensation circuit, and wherein the tunable element comprises at least one fixed reactive element controlled by at least one micro-electro-mechanical system device to produce a variable reactance.

17. The communication device of claim 1, wherein a compensation parameter determined from the backscatter current tunes a tunable element of the tunable compensation circuit to control the variable impedance of the tunable compensation circuit, and wherein the tunable element comprises at least one variable reactive element controlled by at least one micro-electro-mechanical system device to produce a variable reactance.

18. The communication device of claim 1, wherein a compensation parameter determined from the backscatter current tunes a tunable element of the tunable compensation circuit to control the variable impedance of the tunable compensation circuit, and wherein the tunable element comprises at least one variable reactive element controlled by a bias signal that varies a dielectric constant of the variable reactive element to produce a variable reactance.

19. The communication device of claim 1, wherein a compensation parameter determined from the backscatter current sets the variable circuit configuration of the tunable compensation circuit, and wherein the variable circuit configuration comprises one of a configurable transmission line, a configurable parasitic antenna element, a configurable reactive component, or combinations thereof.

20. The communication device of claim 1, wherein the communication device is a portable communication device, and wherein the tunable compensation circuit comprises a variable capacitor, a variable inductor, or combinations thereof.

21. The communication device of claim 1, wherein the tunable compensation circuit is tuned in accordance with a compensation parameter that includes one of a binary signal, a bias signal, or both.

22. The communication device of claim 1, wherein the operations further comprise:
determining a mode of operation of the communication device; and
determining a compensation parameter from the mode of operation of the communication device and the received signal, wherein the tunable compensation circuit is tuned in accordance with the compensation parameter.

23. The communication device of claim 1, wherein the tuning of the tunable compensation circuit and the adjusting of the first and second tunable reactances is according to separate algorithms that share information.

24. The communication device of claim 1, wherein the operations performed by the controller further comprise determining from a look-up table according to a mode of operation of the communication device one of
an adjustment to adjust the received signal to obtain an adjusted signal for determining from the adjusted signal a compensation parameter for tuning the tunable compensation circuit,
an initial parameter setting for the first matching network coupled to the first antenna,
an initial parameter setting for the second matching network coupled to the second antenna,
an initial parameter setting for the tunable compensation circuit,
or combinations thereof.

25. A non-transitory machine-readable storage medium, comprising executable instructions that, when executed by a processor, facilitate performance of operations comprising:
adjusting a first tunable reactance of a first matching network and a second tunable reactance of a second matching network to perform impedance matching for first and second antennas respectively, wherein the first and second antennas are coupled to first and second transceivers respectively;
receiving a signal at the first antenna to obtain a received signal, wherein the signal is associated with a reference signal transmitted by the second antenna resulting from connecting the first transceiver to the second antenna;
determining a backscatter signal from a comparison of the received signal to the reference signal; and
responsive to the backscatter signal exceeding a backscatter signal threshold:
determining from the backscatter signal a compensation parameter; and
adjusting a compensation circuit according to the compensation parameter, the compensation circuit comprising a configurable parasitic antenna element coupled to a tunable reactive circuit,
wherein the compensation parameter configures the compensation circuit to absorb radiation from the first antenna, the second antenna or both by way of the configurable parasitic antenna element to reduce mutual coupling between the first and second antennas, and
wherein the adjusting of the compensation circuit comprises controlling the tunable reactive circuit to adjust a resonant frequency of the configurable parasitic antenna element, thereby reducing the mutual coupling between the first and second antennas, and is performed responsive to a determination that the adjusting of the first and second tunable reactances satisfies an impedance matching threshold.

26. The non-transitory machine-readable storage medium of claim 25, wherein the adjusting includes using the compensation parameter to set the compensation circuit to cause the configurable parasitic antenna element to produce a phase difference of about 180 degrees between the configurable parasitic antenna element and the first antenna, the second antenna or both reduce the mutual coupling between the first and second antennas.

27. The non-transitory machine-readable storage medium of claim 25, wherein determining the compensation parameter further comprises determining the compensation parameter from a look-up table according to a mode of operation of a communication device.

28. A method, comprising:
   adjusting, by a system including a processor, a first tunable reactance of a first matching network and a second tunable reactance of a second matching network to perform impedance matching for first and second antennas of a communication device respectively, wherein the first and second antennas are coupled to first and second transceivers respectively;
   comparing, by the system, a signal received at the first antenna to a reference signal transmitted by the second antenna resulting from connecting the first transceiver to the second antenna, thereby obtaining a backscatter signal, wherein the received signal is associated with the reference signal; and
   responsive to the backscatter signal exceeding a backscatter signal threshold:
      determining, by the system, from the backscatter signal a compensation parameter; and
      tuning, by the system, a compensation circuit according to the compensation parameter, the compensation circuit comprising a parasitic antenna element coupled to a tunable reactive circuit,
   wherein the compensation parameter configures the compensation circuit to absorb radiation from the first antenna, the second antenna or both by way of the parasitic antenna element to reduce mutual coupling between the first and second antennas, and
   wherein the tuning of the compensation circuit comprises controlling the tunable reactive circuit to adjust a resonant frequency of the parasitic antenna, thereby reducing the mutual coupling between the first and second antennas, and is performed responsive to a determination that the adjusting of the first and second tunable reactances satisfies an impedance matching threshold.

29. The method of claim 28, wherein the compensation circuit comprises a tunable reactive element, wherein the tunable reactive element comprises a variable capacitor, a variable inductor, or combinations thereof.

30. The method of claim 28, wherein the compensation parameter reduces a correlation between the first and second antennas.

31. The method of claim 28, wherein determining the compensation parameter further comprises determining the compensation parameter from a look-up table according to a mode of operation of the communication device.

* * * * *